(12) United States Patent  
Miyazawa

(10) Patent No.: US 7,639,211 B2
(45) Date of Patent: Dec. 29, 2009

(54) ELECTRONIC CIRCUIT, ELECTRONIC DEVICE, METHOD OF DRIVING ELECTRONIC DEVICE, ELECTRO-OPTICAL DEVICE, AND ELECTRONIC APPARATUS

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 574 days.

(21) Appl. No.: 11/456,307

(22) Filed: Jul. 10, 2006

(65) Prior Publication Data

US 2007/0018078 A1    Jan. 25, 2007

(30) Foreign Application Priority Data

Jul. 21, 2005  (JP)  ............... 2005-210862
Sep. 2, 2005   (JP)  ............... 2005-254496

(51) Int. Cl.
*G09G 3/32*    (2006.01)
*G09G 3/14*    (2006.01)

(52) U.S. Cl. .................................. 345/39; 345/82
(58) Field of Classification Search ............ 345/30–111
See application file for complete search history.

(56) References Cited

U.S. PATENT DOCUMENTS 7,084,576 B2    8/2006  Ito
7,084,668 B2 *  8/2006  Miyake .................. 326/83
2004/0207614 A1  10/2004  Yamashita et al.
2005/0083270 A1   4/2005  Miyazawa
2005/0231450 A1* 10/2005  Takai ..................... 345/77

FOREIGN PATENT DOCUMENTS

CN    1517964 A    8/2004
CN    1540615 A    10/2004
CN    1591104 A    3/2005
JP    A 2003-122301    4/2003
JP    A 2003-223137    8/2003
WO    WO 03/091982 A1   11/2003

* cited by examiner

*Primary Examiner*—Srilakshmi K Kumar
(74) *Attorney, Agent, or Firm*—Oliff & Berridge, PLC

(57) ABSTRACT

An electronic device includes a plurality of first wiring lines, a plurality of second wiring lines that intersect the plurality of first wiring lines, a plurality of unit circuits that are disposed so as to correspond to intersections between the plurality of first wiring lines and the plurality of second wiring lines, and a plurality of reference signal lines that supply reference signals to the plurality of unit circuits. Each of the plurality of unit circuits has a driven element that is driven by a driving voltage or a driving current, a driving unit that supplies the driving voltage or the driving current to the driven element, a switching element that controls electrical connection between an input terminal provided in the driving unit and one of the plurality of second wiring lines, and a capacitor element that has a first electrode connected to the input terminal and a second electrode connected to one of the plurality of reference signal lines, and accumulates a charge between the first electrode and the second electrode.

9 Claims, 14 Drawing Sheets

<WRITING PERIOD Pwrt>

<DRIVING PERIOD Pdrv>

<INITIALIZATION PERIOD Prs1>

<INITIALIZATION PERIOD Prs1>

ELECTRONIC CIRCUIT, ELECTRONIC DEVICE, METHOD OF DRIVING ELECTRONIC DEVICE, ELECTRO-OPTICAL DEVICE, AND ELECTRONIC APPARATUS

BACKGROUND

1. Technical Field

The present invention relates to a technology for controlling behaviors of various driven elements, such as an organic light-emitting diode (hereinafter, referred to as 'OLED') element, a liquid crystal element, an electrophoresis element, an electrochromic element, an electron emission element, a resistor element, or the like.

2. Related Art

In general, various technologies for driving driven elements have been suggested. For example, in JP-A-2003-122301 (see FIG. 1), a structure is disclosed in which a plurality of unit circuits having OLED elements that serve as driven elements are two-dimensionally disposed. Each of the unit circuits includes a driving transistor that controls a current supplied to the OLED element according to a gate voltage, a reset transistor that causes the driving transistor to be diode-connected, and a light-emitting control transistor that switches whether the current is supplied to the OLED element or not. According to this structure, it is possible to compensate for an error (variation) of a threshold voltage of the driving transistor in each of the unit circuits.

Further, in general, various methods of driving driven elements have been suggested. For example, in JP-A-2003-223137 (see paragraph 0014 and FIG. 2), a structure is disclosed in which multi-gray-scale display is performed by controlling a pulse width of a driving signal (for example, current signal), supplied to an OLED element of each pixel. According to this structure, the pulse width of the driving signal is controlled for every pixel according to the comparison results between a data signal designating a gray-scale level of each pixel and a chopping-wave signal whose level temporally varies (hereinafter, referred to as 'reference signal').

Meanwhile, it is preferable that the total number of transistors forming one unit circuit be small. The reason is as follows. If the total number of transistors is large, a structure of a unit circuit becomes complicated, which results in increasing the manufacturing cost. Further, in an electro-optical device that uses the unit circuit as a pixel, if the total number of transistors is large, an opening ratio may be lowered. However, according to the related art, there is a limit in that the total number of transistors in each unit circuit is reduced. For example, according to the structure disclosed in JP-A-2003-122301, in a period in which data is written in the unit circuit, a light-emitting control transistor needs to be provided so as to turn off the OLED element. According to an aspect of the invention, the invention is very effective in simplifying a structure of each unit circuit.

Further, according to a structure disclosed in JP-A-2003-223137 (see FIG. 2), one frame is divided into a scanning period and a light-emitting period, data signals are supplied to all pixels in the scanning period, and OLED elements of all pixels are simultaneously driven by supplying reference signals in the light-emitting period. As such, in a structure in which the scanning period and the light-emitting period are individually set in one frame, it is difficult to sufficiently ensure the time length of the light-emitting period. In addition, if the time length of the light-emitting period is insufficient, the luminance of each OLED element may be insufficient, and thus display becomes darker. Further, if the time length of the light-emitting period is short, a pulse width of a driving signal (in particular, pulse width corresponding to the low luminance) becomes short. However, in an electro-optical element, such as an OLED element or the like, a current may be concentrated in a short period (for example, a spike current may be supplied), and thus characteristic deterioration may occur.

Further, according to a structure disclosed in JP-A-2003-223137 a data signal is supplied to one electrode of a capacitor element. In this structure, it may be required to ensure a sufficient time for accurately setting a potential of the other electrode of the capacitor element when the data signal is supplied.

SUMMARY

An advantage of some aspects of the invention is that it provides an electronic circuit, an electronic device, a method of driving an electronic device, an electro-optical device, and an electronic apparatus, in which a period for driving an electro-optical element is sufficiently ensured.

According to an aspect of the invention, an electronic device includes a plurality of first wiring lines (for example, scanning lines 13 in FIG. 1), a plurality of second wiring lines (for example, data lines 15 of FIG. 1) that intersect the plurality of first wiring lines, a plurality of unit circuits that are disposed so as to correspond to intersections between the plurality of first wiring lines and the plurality of second wiring lines, and a plurality of reference signal lines that supply reference signals (for example, reference signals W[1] to W[m] in embodiments) to the plurality of unit circuits. Further, each of the plurality of unit circuits has a driven element (for example, electro-optical element 35 of FIG. 3) that is driven by a driving voltage or a driving current, a driving nit (for example, an inverter 34 of FIG. 3, or a pair of an inverter 34 and a transistor 39 of FIG. 7) that supplies the driving voltage or the driving current to the driven element, a switching element (for example, transistor 31 of FIG. 3) that controls electrical connection between an input terminal (for example, input terminal T of FIG. 3) included in the driving unit and one of the plurality of second wiring lines, and a capacitor element that has a first electrode connected to the input terminal and a second electrode connected to one of the plurality of reference signal lines, and accumulates a charge between the first electrode and the second electrode.

According to this aspect, a data signal is supplied to the input terminal of the driving unit from the second wiring line through the switching element in a first period. If the reference signal varies after the first period passes, by the capacitive coupling in the capacitor element, the potential of the input terminal varies from the potential of the data signal in the first period by the variation in the reference signal. Accordingly, the driven element that is supplied with the driving voltage or the driving current in a driving period having a time length according to the potential of the input terminal is driven in a state according to the data signal. In addition, since the potential of the second electrode of the capacitor element is directly set by the reference signal line, it is possible to set the potentials at the two electrodes of the capacitor element in a short time.

According to another aspect of the invention, an electronic device includes a plurality of first wiring lines (for example, scanning lines 13 of FIG. 1), a plurality of second wiring lines (for example, data lines 15 of FIG. 1) that intersect the plurality of first wiring lines, a plurality of unit circuits that are disposed so as to correspond to intersections between the plurality of first wiring lines and the plurality of second wiring lines, a selection circuit (for example, scanning line driving circuit 23 in FIG. 1) that selects each of the plurality of first wiring lines in every first period, a data supply circuit (for example, data line driving circuit 25 of FIG. 1) that supplies a data potential to each of the plurality of second wiring lines in each first period, and a signal generating circuit that maintains a constant potential with respect to each of the plurality of reference signal lines in a first period in which a first wiring line corresponding to the corresponding reference signal line is selected, and outputs reference signals (for example, reference signals W[i] to W[m] in embodiments) whose potentials temporally vary in periods different for all of the reference signal lines. Further, each of the plurality of unit circuits has a driven element (for example, electro-optical element 35 of FIG. 3) that as driven by a driving voltage or a driving current, a driving unit (for example, an inverter 34 of FIG. 3, or a pair of an inverter 34 and a transistor 39 of FIG. 7) that supplies the driving voltage or the driving current to the driven element in a period having a time length according to the potential of an input terminal (for example, input terminal T of FIG. 3), a switching element (for example, transistor 31 of FIG. 3) that controls electrical connection between an input terminal and a second wiring line in a first period in which the first wiring line corresponding to the corresponding unit circuit is selected, and a capacitor element that has a first electrode connected to the input terminal and a second electrode connected to one of the plurality of reference signal lines, and accumulates a charge between the first electrode and the second electrode.

According to this aspect, a data signal is supplied to the input terminal of the driving unit through the switching element in a first period. If the reference signal temporally varies in a second period after the first period passes, by the capacitive coupling in the capacitor element, the potential of the input terminal varies from the potential of the data signal in the first period by the variation in the reference signal. Accordingly, the driven element that is supplied with the driving voltage or the driving current in a period having a time length according to the potential of the input terminal is driven in a state according to the data potential. In addition, since the potential of the second electrode of the capacitor element is directly set by the reference signal line, it is possible to set the potentials at the two electrodes of the capacitor element in a short time.

In this case, the second periods in which the potentials of the reference signals temporally vary are individually set for every reference signal line, and the timings thereof are different. Accordingly, if the data potential of one unit circuit is supplied in the first period, the driven element of the corresponding unit circuit is sequentially driven without waiting for the supply of the data potential to the other unit circuits. For example, the driven elements are sequentially driven from the unit circuits in which the supply of the data potential is completed. Accordingly, according to this aspect of the invention, it is possible to sufficiently ensure a period in which the driven element of each unit circuit is driven, as compared with the related art in which a period in which the data potentials are supplied to all the unit circuits and a period in which all OLED elements simultaneously emit light are individually set.

Preferably, the reference signal is a signal that maintains a constant potential in at least a portion of a first period in which a data signal is written, and corresponds to a signal whose potential temporally varies in at least a driving period. However, the potential of the reference signal or a varied aspect of the reference signal in the other period can be appropriately set according to a driving type or a function of the driven element. Further, the time interval between the first period and a time point when the potential of the reference signal temporally starts to vary can also be appropriately set according to a driving type or a function of the driven element.

Preferably, a potential of each of the plurality of reference signal lines varies with a predetermined cycle. Preferably, the electronic device according to the first aspect of the invention further includes a selection circuit that selects each of the plurality of first wiring lines, and a signal generating circuit that sequentially supplies the reference signals to the plurality of reference signal lines in the order in which the first wiring lines are selected. According to this aspect, it is possible to allow the second period of each reference signal to have a sufficient time length. However, the order in which the first wiring lines are selected and the order in which the second period reaches with respect to the reference signal lines corresponding to the first wiring lines do not need to coincide with each other.

Preferably, in a first period, a data signal is supplied to the input terminal through one second wiring line and the switching element, and a potential of the input terminal is set. Preferably, a time length of a driving period in which the driving voltage or the driving current is supplied to the driven element corresponds to the potential of the input terminal set in the first period. According to this aspect, the time length of the driving period in which the driving voltage or the driving current is supplied to the driven element can be set according to the data signal. Preferably, the input terminal is in a floating state in at least a portion of the driving period in which the driving voltage or the driving current is supplied to the driven element. According to this aspect, since the charge of the first electrode can be prevented from leaking, it is possible to surely vary the potential at the input terminal according to the temporal variation of the reference signal.

Preferably, the driving unit supplies the driving voltage or the driving current to the driven element in one of a period in which the potential of the input terminal is greater than a predetermined potential and a period in which the potential of the input terminal is smaller than a predetermined potential. For example, if the potential of the input terminal is greater than the predetermined potential (threshold voltage Vth in embodiments), the driving unit outputs the driving voltage or the driving current. In contrast, if the potential of the input terminal is smaller than the predetermined potential, the driving unit stops the output of the driving voltage or the driving current. According to this aspect, since the electro-optical element is driven in a binary manner, it is possible to suppress the variation in the driving state of the driven element (for example, luminance level of the light-emitting element) due to the characteristic variation of portions of the unit circuit or the driven element. In this case, the driving unit is preferably an inverter.

Preferably, the potential of the one reference signal line is set to at least a first potential when the potential of the input terminal is set by the data signal in the first period, the potential of the one reference signal line is the first potential when a second period starts, the potential of the one reference signal line is a second potential that has a voltage level different from the first potential in the second period, and the potential of the one reference signal line is the first potential when the second period is completed. Preferably, the potential of the one reference signal line in the second period varies axisymmetrically on the basis of a time when the potential of the one reference signal line becomes the second potential. That is, the reference signal has an axisymmetric along a time axis waveform (generally, chopping wave) on the basis of the middle point between the start point and the end point of the second period (for example, center tc of FIG. 2 or 4).

According to this aspect, the center on the time axis of the period in which the driven element is actually driven (for example, period in which the electro-optical element emits light) can be allowed to become the center of the second period regardless of the data signal. However, the aspect of the variation in the potential of the reference signal line (waveform of the reference signal) does not need to be axisymmetric. That is, the potential of each reference signal line (that is, reference signal) is preferably set, such that the shortest driving period of the plurality of driving periods corresponding to the individual data signals, except for the driving period having the time length of zero, overlaps on the time axes of the driving periods having the time lengths larger than that of the shortest period and the second period. For example, referring to FIG. 4, the reference signal is generated, such that the driving period overlaps on the time axis of the second period Pb[i] for the driving period of the gray-scale level G2 or G3 (driving period longer than the driving period corresponding to the gray-scale level G1) with respect to the gray-scale level G1 of the gray-scale levels G0 to G3, which corresponds to a shortest time length in which the driving period for which the driving current Sdr flows is not zero.

Preferably, the plurality of reference signal lines extend in a direction that intersect the plurality of second wiring lines. According to this aspect, it is possible to surely supply the common reference signal to the unit circuits commonly connected to one first wiring line through the reference signal line with a simple shape extending along the corresponding first wiring line.

Preferably, each of the plurality of unit circuits has a reset unit (for example, transistor 37 of FIG. 5) that sets the potential of the input terminal to a predetermined potential before the first period in which the data signal is supplied to the input terminal through the one second wiring line and the switching element. According to this aspect, since the potential of the input terminal is initialized to the predetermined potential before the first period, the potential of the input terminal can be surely set to the data potential at high speed in the first period.

According to another aspect of the invention, there is provided an electronic apparatus that has the above-mentioned electronic device. Generally, the electronic apparatus uses the electronic device as a display device. Examples of the electronic apparatus include a personal computer, a cellular phone, or the like. However, the utilization of the electronic device according to the above-mentioned aspects is not limited to only the image display. For example, the electronic device may be used as an exposure device (exposure head) that forms a latent image on an image carrier, such as a photoreceptor drum, by irradiating light beams thereon.

The driven element includes all elements that are electrically driven. The driven element corresponds to an electro-optical element (for example, a light-emitting element, such as an OLED element or the like) in which optical characteristics, such as the luminance or the transmittance, vary by supplying electric energy (for example, application of an electric field). The electro-optical device is exclusively used in driving the electro-optical element. According to another aspect of the invention, an electro-optical device includes a plurality of scanning lines, a plurality of data lines that intersect the plurality of scanning lines, a plurality of unit circuits that are disposed so as to correspond to intersections between the plurality of scanning lines and the plurality of data lines, and a plurality of reference signal lines that supply reference signals to the plurality of unit circuits. Further, each of the plurality of unit circuits has an electro-optical element that is driven by a driving voltage or a driving current, a driving unit that supplies the driving voltage or the driving current to the electro-optical element, a switching element that controls electrical connection between an input terminal provided in the driving unit and one of the plurality of data lines, and a capacitor element that has a first electrode coupled to the input terminal and a second electrode coupled to one of the plurality of reference signal lines, and accumulates a charge between the first electrode and the second electrode. Furthermore, a time length of a driving period in which the driving voltage or the driving current is supplied to the electro-optical element corresponds to a potential of the input terminal that is set by supplying a data signal to the input terminal through the one data line and the switching element in the first period. In this case, it is possible to achieve the same advantages and effects as the electronic device according to the aspect of the invention.

According to another aspect, there is provided a method of driving an electronic device, which has a plurality of first wiring lines, a plurality of second wiring lines that intersect the plurality of first wiring lines, a plurality of unit circuits that are disposed so as to correspond to intersections between the plurality of first wiring lines and the plurality of second wiring lines, and a plurality of reference signal lines. In the electronic device, each of the plurality of unit circuits has a driven element that is driven by a driving voltage or a driving current, a driving unit that supplies the driving voltage or the driving current to the driven element, and a capacitor element that has a first electrode coupled to the input terminal and a second electrode coupled to one of the plurality of reference signal lines, and accumulates a charge between the first electrode and the second electrode. The method includes setting the potential of the input terminal by supplying the data signal to the input terminal through one of the plurality of second wiring lines in a first period, and varying a potential of each of the plurality of reference signal lines with a predetermined cycle. In this case, it is possible to achieve the same advantages and effects as the electronic device according to the aspect of the invention.

According to another aspect of the invention, an electronic device includes signal lines, unit circuits that are coupled to the signal lines, and voltage supply lines. Further, each of the unit circuits has a driving transistor that has a control terminal (for example, gate), a first terminal (one of a source and a drain), and a second terminal (the other of a source and a drain) coupled to the voltage supply line, a conductive state between the first terminal and the second terminal being set according to a voltage of the control terminal, a driven element (for example, electro-optical element 11 of FIG. 10), a first switching element (for example, transistor T1 of FIG. 10) that control electrical connection between the control terminal of the driving transistor and one of the first terminal and the second terminal, and a capacitor element (for example, capacitor element C of FIG. 10) that has a dielectric provided between a first electrode (for example, first electrode Ea of FIG. 10) and a second electrode (for example, second electrode Eb of FIG. 10), the first electrode being coupled to the control terminal of the driving transistor, the second electrode being coupled to the signal line. Further, a level of at least one of the driving current and the driving voltage that are supplied to the driven element is set according to the conductive state between the first terminal and the second terminal.

According to this aspect, the control terminal of the driving transistor and one of the first terminal and the second terminal are electrically connected to each other through the first switching element so as to compensate for the error of the threshold voltage of the driving transistor. Further, the voltage of the gate of the driving transistor is set to the voltage value according to the voltage of the signal line by the capacitive coupling in the capacitor element. Accordingly, by using the very simple configuration, the driven element can be driven while compensating for the error of the threshold voltage of the driving transistor (difference between the threshold voltage of one driving transistor and the designed value, or difference between the threshold voltages of the driving transistors in the respective unit circuits in the configuration that includes the plurality of unit circuits).

Further, in the electronic device according to the above-mentioned aspect of the invention, a switching element may be further provided so as to control electrical connection between the signal line and the second electrode (switch whether the voltage of the signal line is supplied to the second electrode). However, in order to simplify the structure of the unit circuit, it is preferable that the second electrode be directly connected to the signal line (that is, without the switching element being interposed therebetween).

Preferably, in a first period (for example, writing period Pwrt of FIG. 9), the control terminal of the driving transistor and one of the first terminal and the second terminal are electrically connected to each other through the first switching element, in the first period, data signal (for example, data voltage Vdata in FIG. 9) is supplied to the second electrode through the signal line, and in a second period (for example, driving period Pdrv in FIG. 9), a control signal (for example, control voltage Vct1 of FIG. 9) that temporally varies in the second period is supplied to the second electrode.

According to this aspect, the data signal is held in the second electrode in the first period, and the voltage of the second electrode temporally varies in the second period. In addition, the voltage of the first electrode (that is, voltage of the gate of the driving transistor) varies by the voltage value according to the difference between the levels of the data signal and the control signal through the capacitive coupling in the capacitor element. Accordingly, according to this aspect, it is possible to drive the driven element over the time length according to the data signal. Further, if the configuration in which the first electrode enters a floating state in the second period is adopted, it is possible to suppress the charge accumulated in the first electrode from leaking. Therefore, it is possible to set the voltage of the first electrode to the voltage according to the data signal in high precision.

Further, according to this aspect, the circuit for supplying the data signal to the unit circuit and the circuit for supplying the control signal to the unit circuit may be independently mounted on the electronic device so as to be separated from each other, or may be mounted on the electronic device in a state in which they are mounted on a single circuit (for example, IC chip). Further, the signal line may be used as the wiring line for supplying the control signal to the unit circuit or the control signal may be supplied to the unit circuit through the wiring line that is separated from the signal line.

Preferably, the electronic device according to the above-mentioned aspect further includes a voltage control circuit that sets a voltage of the voltage supply line to one of a plurality of voltage values (for example, controls electrical connection between the voltage supply line and the predetermined potential). Preferably, the voltage control circuit sets the voltage of the voltage supply line to a first voltage value (for example, voltage value Vss) having a potential lower than the first terminal in at least a portion of the first period, and sets the voltage of the voltage supply line to a second voltage value (for example, voltage value Vdd) having a potential higher than the first terminal in at least a portion of the second period.

According to this aspect, in at least the portion of the first period (specifically, at least a portion of a period in which a first terminal or a second terminal is coupled to a control terminal), the voltage of the voltage supply line is set to the first voltage of the potential that is lower than that of the first terminal. Accordingly, in the period, the electric energy applied to the driven element (driving current or driving voltage supplied to the driven element) is reduced, as compared with a case in which the voltage of the voltage supply line is set to the second voltage. Accordingly, even though the switching element (for example, 'light emission controlling transistor' in JP-A-2003-122301) for controlling whether the electric energy is applied to the driven element is not disposed, principally, it is possible to suppress (ideally, stop) the supply of the electric energy to the driven element in the first period. However, even though it is said that the light emission controlling transistor principally does not need to be provided, the configuration in which the light emission controlling transistor is disposed is not excluded from the range of the invention. That is, in order to surely define the period in which the driven element is driven, as in the light emission controlling transistor disclosed in JP-A-2003-122301, the switching element may be disposed which controls whether the electric energy is applied to the driven element or not.

Meanwhile, as the transistor that form the unit circuit (in particular, driving transistor), for example, it is possible to adopt transistors (ideally, thin-film transistors) that have semiconductor layers made of various semiconductor materials (for example, polycrystalline silicon, microcrystalline silicon, single-crystalline silicon or amorphous silicon). In the transistor whose semiconductor layer is formed of, for example, amorphous silicon, if the direction of the current flowing through the corresponding transistor is constantly fixed, it has known that the threshold voltage temporally varies. According to this aspect, in the first period, the current (for example, current I0 of FIG. 11) flows from the first terminal to the voltage supply line via the second terminal. Meanwhile, in the second period, the current is supplied from the second terminal to the driven element via the first terminal. That is, the direction of the current flowing through the driving transistor is reversed in the first period and the second period. Accordingly, according to this aspect, even though the semiconductor layer of the driving transistor is formed of amorphous silicon, the variation of the threshold voltage thereof can be suppressed. That is, the configuration in which the semiconductor layer of the driving transistor is formed of amorphous silicon can be appropriately adopted.

Preferably, the first switching element corresponds to a switching transistor, and the transistors included in the unit circuit correspond to the driving transistor and the switching transistor. According to this aspect, the error of the threshold voltage of the driving transistor can be compensated while reducing the number of the transistors in the unit circuit to two transistors including the driving transistor and the switching transistor. The specific example will be described in a third embodiment (FIG. 10) to be described below.

Specifically, if the voltage of the first terminal is greater than the predetermined voltage, the driving element is driven, and the first voltage value is determined such that the voltage of the first terminal is smaller than the predetermined voltage in the first period. According to this aspect, since the voltage of the first terminal is lower than the predetermined voltage in the first period, even though the light emission controlling transistor is not disposed, it is possible to surely stop the driving (for example, light emission) of the driven element in the first period.

Meanwhile, in the first terminal of the driving transistor, the voltage value may accidentally vary due to the external disturbance, such as noise. In addition, due to the voltage value after the variation (for example, in a case in which the voltage of the first terminal is riot more than the second voltage), the returning of the driven element to the predetermined driving state may be inhibited. Preferably, the unit circuit further includes a first reset unit that sets a voltage of the first terminal to a predetermined voltage. According to this aspect, even though the voltage of the first terminal accidentally varies, the voltage of the first terminal is set to a predetermined voltage by the first reset unit. As such, the voltage of the first terminal is set again to the voltage in which the driven element can be driven, and the stable operation of the driven element can be performed. The timing when the voltage of the first terminal is set to the predetermined voltage by the reset unit is arbitrarily set. For example, in a predetermined period, such as a period before the each first period starts, the voltage of the first terminal may be set. In addition, in a case in which various operators, such as operators for supplying a power, are operated by a user, the voltage of the first terminal may be set.

Preferably, the first reset unit includes a second switching element (for example, transistor T2 of FIG. 13) that electrically connects the first terminal and a power line in an initialization period, and the voltage control circuit sets the voltage of the voltage supply line to the second voltage in the initialization period. According to this aspect, since the voltage supply line can also be used in order to reset the voltage of the first terminal, the structure of the electronic device can be simplified, as compared with a structure in which the wiring line separated from the voltage supply line is used in resetting of the voltage of the first terminal. Further, a specific example of this aspect will be described in a second embodiment to be described below.

Alternatively, the first reset unit includes a second switching element (for example, transistor T2 of FIG. 17) that electrically connects the first terminal and a power line supplied with a constant voltage in an initialization period, and the voltage control circuit sets the voltage of the voltage supply line to the first voltage in the initialization period. According to this aspect, since the voltage of the voltage supply line is set to the first voltage in the initialization period, it is possible to surely stop the driving (for example, light emission) of the driven element in the initialization period. Further, a specific example of this aspect will be described in a third embodiment to be described below.

Preferably, the unit circuit further includes a second reset unit that sets a voltage of a control terminal of a driving transistor to a predetermined voltage. According to this aspect, since the voltage of the control terminal of the driving transistor is set to the predetermined voltage, it is possible to set the voltage of the control terminal of the driving transistor to the predetermined voltage in high precision regardless of the situation of the control terminal.

Preferably, the second reset unit includes a third switching element (for example, transistor T3 of FIG. 20) that electrically connects the control terminal and a voltage supply line in an initialization period, and the voltage control circuit sets the voltage of the voltage supply line to the second voltage in the initialization period. According to this aspect, the voltage of the control terminal is set to the second voltage in the initialization period. In addition, since the voltage supply line can also be used in order to reset the voltage of the control terminal, the structure of the electronic device can be simplified, as compared with a structure in which the wiring line separated from the voltage supply line is used in resetting of the voltage of the first terminal. Further, a specific example of this aspect will be described in a sixth embodiment to be described below.

The electronic device according to this aspect is used in various electronic apparatuses. Generally, the electronic apparatus uses the electronic device as a display device. Examples of the electronic apparatus include a personal computer, a cellular phone, or the like. However, the utilization of the electronic device according to the above-mentioned aspects is not limited to only the image display. For example, the electronic device may be used as an exposure device (exposure head) that forms a latent image on an image carrier, such as a photoreceptor drum, by irradiating light beams thereon.

The driven element according to this aspect includes all elements that are electrically driven. The driven element corresponds to an electro-optical element in which optical characteristic (gray-scale level), such as the luminance or the transmittances varies by supplying electric energy. The electro-optical device is exclusively used in driving the electro-optical element in the electronic device. According to another aspect of the invention, an electro-optical device (for example, a light-emitting device in which a light-emitting element is used as an electro-optical element) includes signal lines, unit circuits that are coupled to the signal lines, and voltage supply lines. Further, each of the unit circuits includes a driving transistor that has a control terminal, a first terminals and a second terminal coupled to the voltage supply line, a conductive state between the first terminal and the second terminal being set according to a voltage of the control terminal, an electro-optical element, a first switching element that control electrical connection between the control terminal of the driving transistor and one of the first terminal and the second terminal, and a capacitor element that has a dielectric provided between a first electrode and a second electrode, the first electrode being coupled to the control terminal of the driving transistor, the second electrode being coupled to the signal line. Further, a level of at least one of a driving current and a driving voltage that are supplied to the electro-optical element is set according to the conductive state between the first terminal and the second terminal. According to this aspect, it is possible to achieve the same advantages and effects as the above-mentioned electronic device. Further, the various aspects of the electronic devices can be applied to the electro-optical device.

According to another aspect of the invention, an electronic circuit that drives a driven element includes signal lines, unit circuits that are coupled to the signal lines, and voltage supply lines. Further, each of the unit circuits has a driving transistor that has a control terminal, a first terminal, and a second terminal coupled to the voltage supply line, a conductive state between the first terminal and the second terminal being set according to a voltage of the control terminal, a first switching element that controls electrical connection between the control terminal of the driving transistor and one of the first terminal and the second terminal, and a capacitor element that has a dielectric provided between a first electrode and a second electrode, the first electrode being coupled to the control terminal of the driving transistor, the second electrode being coupled to the signal line. Furthermore, a level of at least one of the driving current and the driving voltage that are supplied to the driven element is set according to the conductive state between the first terminal and the second terminal. According to this aspect, it is possible to achieve the same advantages and effects as the above-mentioned electronic device. In the electronic circuit according to this aspect, whether the driven element is provided or not is not important. Further, the various aspects of the electronic devices can be applied to the electronic circuit.

According to another aspect of the invention, there is provided a method of driving an electronic device, which has unit circuits, each of the unit circuits including a driven element, and a driving transistor that has a control terminal, a first terminal, and a second terminal coupled to the voltage supply line, a conductive state between the first terminal and the second terminal being set according to a voltage of the control terminal. The method includes causing one of the first terminal and the second terminal to be electrically connected to the control terminal of the driving transistor in a first period, supplying a data signal to the second electrode through the signal line in the first period, and supplying a control signal varying temporally in a second period to the second electrode, in the second period. According to this aspect, it is possible to achieve the same advantages and effects as the above-mentioned electronic device. Further, the various aspects of the electronic devices can be applied to the method of driving an electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
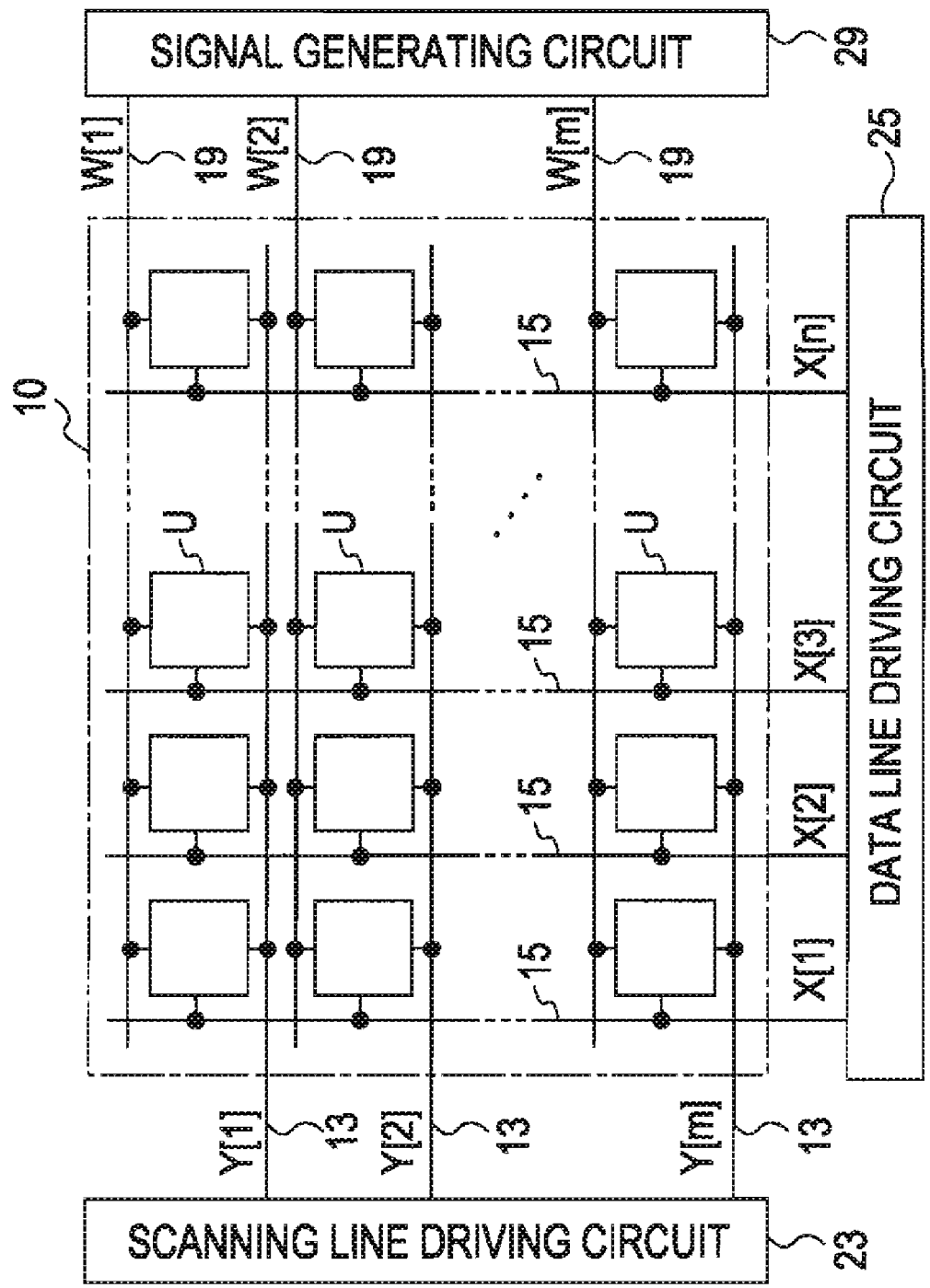
FIG. 1 a block diagram illustrating a structure of an electronic device according to a first embodiment of the invention.

FIG. 1 is a block diagram illustrating a structure of an electronic device according to a first embodiment of the invention. An electronic device D shown in FIG. 1 is corresponds to an electro-optical device that is used in various electronic apparatuses as an image display device, and includes an element array unit 10 in which a plurality of unit circuits U are two-dimensionally disposed, and various circuits (a scanning line driving circuit 23, a data ling driving circuit 25, and a signal generating circuit 27) that drives the unit circuits U. In this case, each of the scanning line driving circuit 23, the data line driving circuit 25, and the signal generating circuit 27 may be mounted on the electronic device D as an independent circuit, or a portion or all of these circuits may be mounted on the electronic device D as a single circuit.

As shown in FIG. 1, the element array unit 10 includes m scanning lines 13 that extend in an X direction, m reference signal lines 17 that extend in an X direction, each of which forms a couple together with a corresponding scanning line 13, and n data lines 15 that extend in a Y direction orthogonal to the X direction (in this case, each of m and n is a natural number). Each of the unit circuits U is disposed at a location that corresponds to an intersection between a pair of a scanning line 13 and a reference signal line 17 and each data line 15. Accordingly, the unit circuits U are disposed in a matrix of m rows×n columns.

Figure 2:
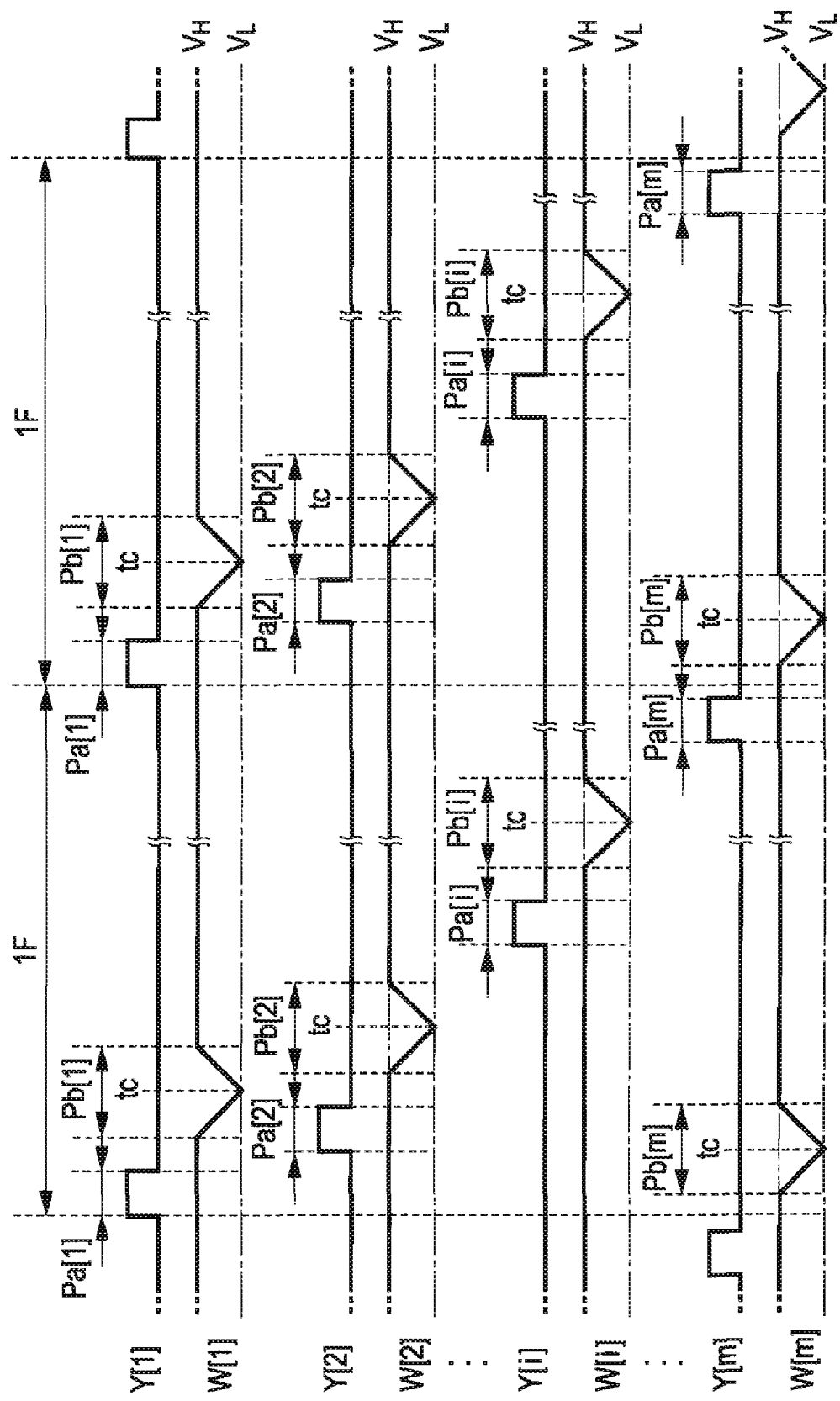
FIG. 2 is a timing chart illustrating waveforms of a scanning signal Y[i] and a reference signal W[i].

The scanning line driving circuit 23 sequentially selects each of the m scanning lines 13. Specifically, as shown in FIG. 2, the scanning line driving circuit 23 generates scanning signals Y[1] to Y[m] that sequentially become high levels for predetermined periods Pa[1] to Pa[m] (hereinafter, referred to as 'first period') set for every frame (1F) and outputs them to the corresponding scanning lines 13. A scanning signal Y[i] that is supplied to a scanning line 13 of an i-th row (i is an integer that satisfies the condition $1 \leq i \leq m$) becomes a high level in an i-th first period Pa[i] of one frame (1F), and becomes a low level in the other periods. If a voltage level of the scanning signal Y[i] becomes a high level, it means that the i-th row is selected.

In FIG. 1, the data line driving circuit 25 supplies data signals X[1] to X[n] to unit circuits U of one row (n unit circuits) corresponding to the scanning line 13 selected by the scanning line driving circuit 23 through the corresponding data lines 15, respectively. A potential of a data signal x[j], which is supplied to a data line 15 of a j-th column (j is an integer that satisfies the condition 1≦j≦n) in a first period Pa[i] in which a scanning line 13 of an i-th row is selected, becomes a potential Vdata that corresponds to a gray-scale level (luminance) designated for a unit circuit U of the j-th column that belongs to the i-th row. A gray-scale level of each of the unit circuits U is designated by gray-scale data that is supplied from the exterior.

The signal generating circuit 27 generates reference signals W[1] to W[m] and outputs them to the corresponding m reference signal lines 17, respectively. As shown in FIG. 2, a reference signal W[i] maintains a potential VH from a start point to an end point of a first period Pa[i] in which the scanning signal Y[i] becomes a high level, and has a potential that temporally varies from a start point to an end point of a predetermined period Pb[i] (hereinafter, referred to as 'second period') after the first period Pa[i] passes.

In the present embodiment, the reference signal W[i] is a chopping-wave signal in which a waveform from a middle point tc (that is, a time point having the same time length from a start point and an end point of the second period Pb[i]) of the second period Pb[i] to a start point and a waveform from the middle point tc to the end point are axisymmetric to each other on the basis of the middle point tc. That is, when the time passes, the potential of the reference signal W[i] decreases from the potential VH to the potential VL lower than the potential VH in a time interval from the start point of the second period Pb[i] to the middle point tc of the second period Pb[i], and increases from the potential VL in a time interval from the middle point tc to the end point and reaches the potential VH again.

As shown in FIG. 2, phases of the reference signals W[1] to W[m] are different from one another. That is, the second periods Pb[1] to Pb[m] in which the reference signals W[1] to W[m] vary are individually set for every reference signal line 17 (every row), and thus they are different from one another. Specifically, the second periods Pb[1] to Pb[m] that are defined by the reference signals W[1] to W[m] supplied to the reference signal lines 17 are sequentially designated in the order in which the scanning signals Y[1] t Y[m] corresponding to the reference signal lines 17 become high levels. Accordingly, as shown in FIG. 2, the reference signal W[i] varies within a range from the potential VH to the potential VL when a scanning signal Y[i+1] of a next row becomes a high level.

Figure 3:
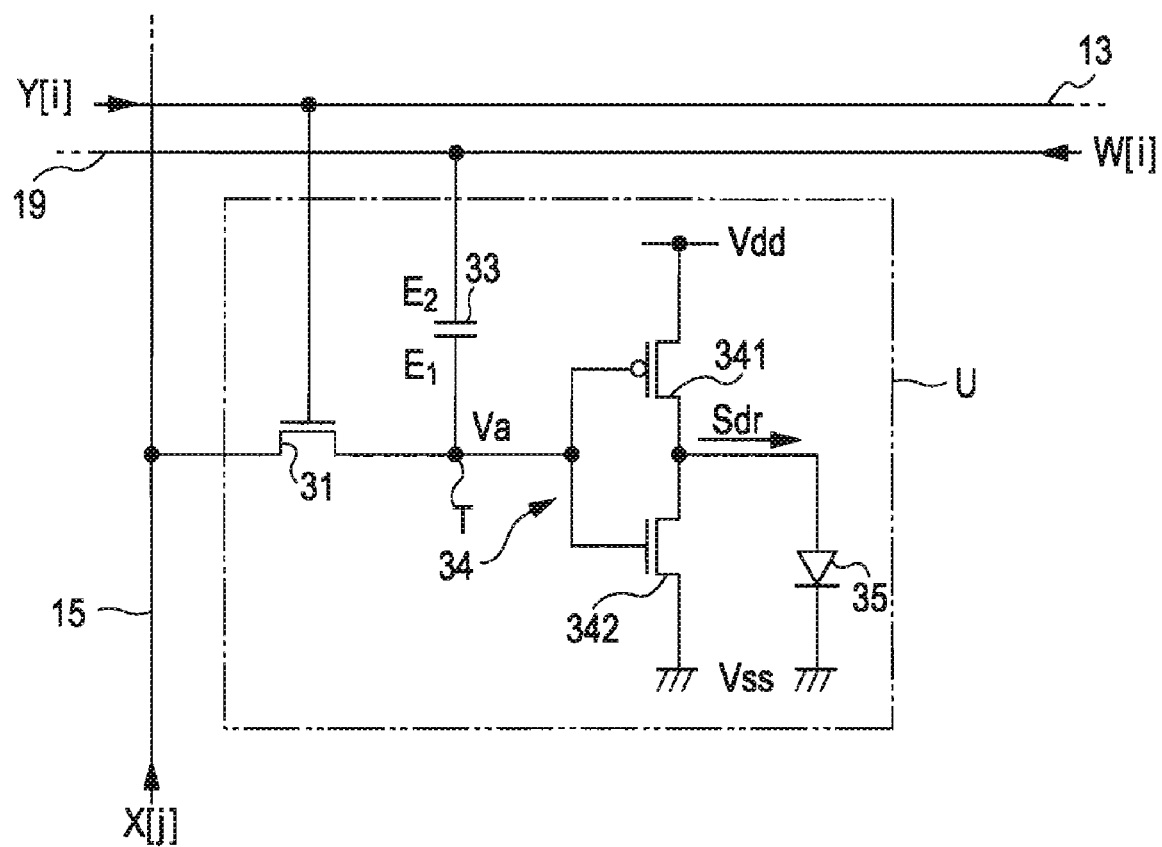
FIG. 3 is a circuit diagram illustrating a structure of one unit circuit.

Next, a specific structure of each of the unit circuits U will be described with reference to FIG. 3. In FIG. 3, only a unit circuit U that is disposed at a location of an i-th row and a j-th column is shown, but the other unit circuits U also have the same structure.

As shown in FIG. 3, each of the unit circuits U has a transistor 31, a capacitor element 33, an inverter 34, and an electro-optical element 35. The electro-optical element 35 corresponds to an OLED element having a structure in which a light-emitting layer made of an organic EL material is interposed between an anode and a cathode, and emits light with a luminance level according to a current level of a driving current Sdr that is outputted from the inverter 34. Further, an integration value obtained by integrating the luminance level by the time corresponds to the luminance.

The inverter 34 has a p-channel-type transistor 341 and an n-channel-type transistor 342. A source of the transistor 341 is coupled to a power line that is supplied with a high power supply potential Vdd. A source of the n-channel-type transistor 342 is coupled to a ground line that is supplied with a low power supply potential Vss (hereinafter, referred to as 'ground potential'). Drains of the p-channel-type transistor 341 and the n-channel-type transistor 342 are commonly coupled to an anode of the electro-optical element 35. Further, gates of the p-channel-type transistor 341 and the n-channel-type transistor 342 are coupled to an input terminal T.

When a potential Va at the input terminal T of the inverter 34 is smaller than a predetermined potential Vth (hereinafter, simply referred to as threshold voltage) the transistor 341 is turned on, and the driving current Sdr is supplied to the electro-optical element 35. The driving current Sdr corresponds to a current that causes the electro-optical element 35 to emit light. In contrast, when the potential Va is greater than the threshold voltage Vth, the transistor 341 is turned off, and the transistor 342 is turned on. As a result, the supply of the driving current Sdr to the electro-optical element 35 is stopped.

As shown in FIG. 3, the capacitor element 33 has a first electrode E1 that is coupled to the input terminal T of the inverter 34 and a second electrode E2 that is coupled to the reference signal line 17, and accumulates a charge between the first electrode E1 and the second electrode E2. Further, an n-channel-type transistor 31 is a switching element that is interposed between the input terminal T of the inverter 34 and the data line 15 and controls electrical connection between the input terminal T of the inverter 34 and the data line 15 (conduction or non-conduction). A gate of the transistor 31 is coupled to the scanning line 13. Accordingly, in a first period Pa[i] in which the scanning signal Y[i] becomes a high level the transistor 31 is turned on, and in a period in which the scarring signal Y[i] becomes a low level, the transistor 31 is turned off.

Next, a specific operation of the electronic device D according to the present embodiment will be described. In the description below, the operation of the unit circuit U of the j-th column that belongs to the i-th row will be described while dividing the period of the operation into the first period Pa[i] and the second period Pb[i].

First Period Pa[i]

In the first period Pa[i], the level of the scanning signal Y[i] is shifted from a low level to a high level. Therefore, the transistor 31 is turned on, and the input terminal T and the data line 15 are electrically connected to each other. Thereby, the input terminal T of the inverter 34 is supplied with a potential Vdata of a data signal X[j] from the data line 15. The charge according to the potential Vdata is held in the capacitor element 33. As shown in FIG. 2, since the reference signal W[i] that is supplied to the second electrode E2 of the capacitor element 33 maintains a constant potential (potential VH) in the first period Pa[i], the potential Va of the input terminal T is held as the potential Vdata according to the gray-scale level of the unit circuit U.

Second Period Pb[i]

After the first period Pa[i] passes, if the scanning signal Y[i] becomes a low level, the transistor 31 is turned off. As a result, the input terminal T is electrically separated from the data line 15, and is in a floating state. This state is maintained even in the second period Pb[i]. Accordingly, if the reference signal W[i] supplied to the second electrode E2 of the capacitor element 33 varies within a range from the potential VH to the potential VL in the second period Pb[i], by capacitive coupling in the capacitor element 33, the potential Va of the input terminal T (potential of the first electrode E1) varies by the variation of the reference signal W[i] from the potential. Vdata set in the first period Pa[i] right before the second period Pb[i].

Figure 4:
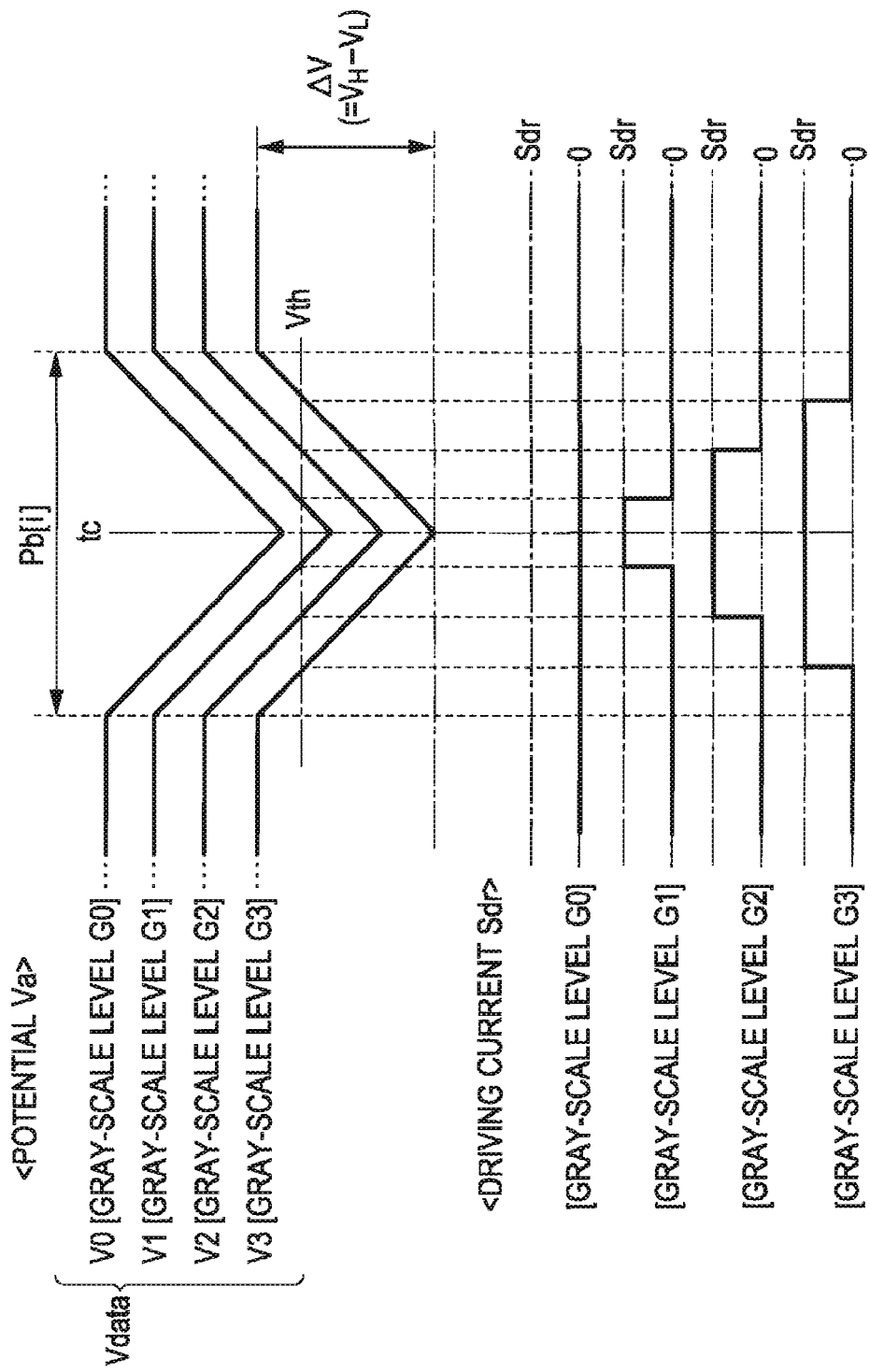
FIG. 4 is a timing chart illustrating the relationship between a potential Va and a driving current Sdr.

FIG. 4 is a timing chart illustrating the relationship between the potential Va of the input terminal T and the driving current Sdr outputted from the inverter 34. In FIG. 4, a waveform of the potential Va when the corresponding gray-scale levels G0 to G3 are designated to the unit circuits U are also shown. Further, in FIG. 4, each of the potentials V0 to V3 corresponds to the potential Vdata of the data signal X[j] when each of the gray-scale levels G0 to G3 is designated (that is, potential Va set in the first period Pa[i]).

As shown in FIG. 4, the potential Va of the input terminal T varies by $\Delta V$ (=VH−VL) when the reference signal W[i] varies in the second period Pb[i]. At a start point of the second period Pb[i], the potential Va is set to the potential Vdata according to the corresponding gray-scale level. As a result, a period (hereinafter, referred to as 'driving period') of the second period Pb[i] in which the potential Va of the input terminal T is smaller than the threshold voltage Vth of the inverter 34 has a time length according to the potential Vdata that is supplied from the data line 15 in the first period Pa[i] right before the second period Pb[i]. For example, since the potential Vdata (V1) corresponding to the gray-scale level G1 is higher than the potential Vdata (V2) corresponding to the potential G2, the time length in which the potential Va is smaller than the threshold voltage Vth when the gray-scale level G2 is designated is longer than the time length in which the potential Va is smaller than the threshold voltage Vth when the gray scale G1 is designated. Further, in a case in which the gray-scale level G0 is designated, the potential Va is greater than the threshold voltage Vth over all intervals of the second period Pb[i].

Since the potential Va of the input terminal T varies as described above, in the driving period that has a time length (pulse width) according to the data signal X[j], the driving current Sdr is supplied from the inverter 34 to the electro-optical element 35, and the supply of the driving current Sdr to the electro-optical element 35 is stopped in the remaining period. For examples as shown in FIG. 4, the driving period in which the driving current Sdr is supplied to the electro-optical element 35 when the gray-scale level G2 is designated is longer than the driving period in which the driving current Sdr is supplied to the electro-optical element 35 when the gray scale G1 is designated. Further, in a case in which the gray-scale level G0 is designated, the supply of the driving current Sdr to the electro-optical element 35 is stopped over all intervals of the second period Pb[i]. Since the electro-optical element 35 emits light by the driving current Sdr, an the present embodiment, the electro-optical element 35 emits light in time density according to the potential Vdata of the data signal X[j]. Thereby, the gray-scale level of the electro-optical element 35 is controlled for every unit circuit U.

Until now, only the operation of one unit circuit U has been described, but the same operation is performed in the unit circuits U in a row unit. Specifically, as shown in FIG. 2, the supply of the potential Vdata to the input terminal T (first period Pa[i]) and the variation of the potential Va according to the reference signal W[i] (second period Pb[i]) are sequentially performed for every unit circuit U of each row with individual timing. Accordingly, if the data signal X[j] is inputted to one unit circuit U in the first period Pa[i] (that is, if the potential Vdata is supplied to the input terminal T), the electro-optical elements 35 are sequentially driven without waiting for the data signals X[j] being inputted to the other unit circuits U. That is, the electro-optical elements 35 emit light from the unit circuits U in the order in which the input of the data signal X[j] is completed.

As described above, according to the present embodiment, since the electro-optical elements 35 are driven in a binary manner by the supply and the stop of the driving current Sdr, it is possible to reduce the influence due to the characteristic variation of the transistor that forms the electro-optical element 35 or the inverter 34, as compared with a structure in which the current supplied to the electro-optical elements 35 (or voltage applied to the electro-optical elements 35) are controlled step by step according to the respective gray-scale levels. Further, according to the present embodiment, since the potential of the second electrode E2 of the capacitor element 33 is directly set by the reference signal line 17, the potential of each electrode of the capacitor element 33 can be set in a short time.

According to the present embodiment, it is possible to lengthen the period in which each electro-optical element 35 emits light, as compared with the structure according to the related art in which the scanning period in which the data signals are supplied to all the unit circuits and the light-emitting period in which makes all the OLED elements simultaneously emit light are individually set. Accordingly, it is possible to make each electro-optical element 35 emit light with the sufficient luminance. In addition, as compared with the structures according to the related art, since the pulse width of the driving current Sdr can be set to have a large size, it is possible to prevent the intermittent concentration of the current to the electro-optical element 35 (supply of the spike current). Therefore, it is possible to suppress the characteristic of the electro-optical element 35 from being deteriorated.

Second Embodiment

Next, a second embodiment of the invention will be described. In the second embodiment, the same constituent elements as the first embodiment are denoted by the same reference numerals, and the description thereof will be appropriately omitted.

Figure 5:
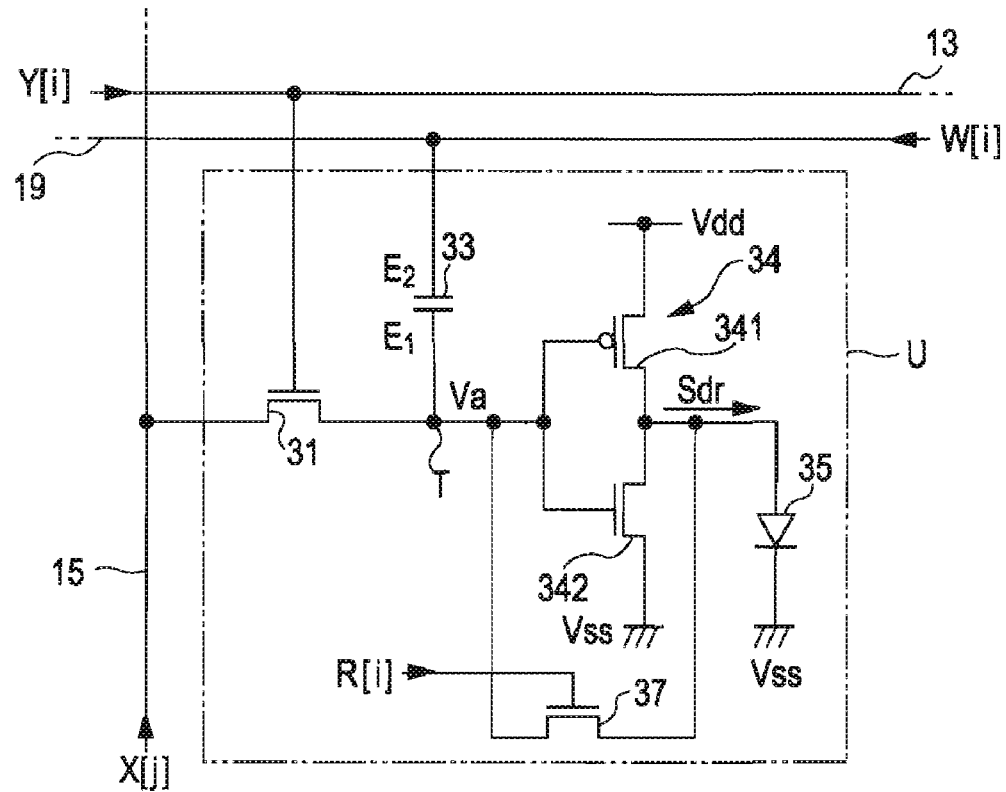
FIG. 5 is a circuit diagram illustrating a structure of one unit circuit in an electronic device according to a second embodiment of the invention.

FIG. 5 is a circuit diagram illustrating a structure of one unit circuit U in an electronic device D according to the present embodiment. As shown in FIG. 5, the unit circuit U according to the present embodiment has a structure in which an n-channel-type transistor 37 is additionally provided in the structure according to the first embodiment shown in FIG. 3. The transistor 37 corresponds to a switching element that is interposed between the input terminal T and the output terminal of the inverter 34 and controls electrical connection between the input terminal T and the output terminal of the inverter 34 (conduction or non-conduction).

The gate of the transistor 37 is coupled to a wiring line that is supplied with a reset signal R[i]. The reset signal R[i] becomes a high level in a period before the first period Pa[i] in which the scanning signal Y[i] becomes a high level, and maintains a low level in the other period. That is, the reset signals R[1] to R[m] become sequentially a high level in the order in which the respective rows are selected.

In the above-mentioned structure, if the reset signal R[i] becomes a high level, the transistor 37 is turned on, and the input terminal T and the output terminal of the inverter 34 are electrically connected to each other. Accordingly, the potentials at the input terminal T and the output terminal of the inverter 34 become a potential that corresponds to the difference (Vdd−Vth_P) between the power supply potential Vdd and the threshold voltage Vth_P of the p-channel-type transistor 341. As such, the potential Va of the input terminal T is set to the predetermined value before the first period Pa[i], and it is possible to surely set the potential Va of the input terminal T to the potential Vdata in a short time in the first period Pa[i]. Further, since the potential between the electro-optical element 35 and the output terminal of the inverter 34 is initialized to a predetermined value, it is possible to uniform the time necessary for the response of the electro-optical element 35 in the plurality of unit circuits U.

Modification

Various modifications can be made in the above-mentioned embodiments. An aspect of a specific modification is as follows. Various modifications to be described below may be appropriately combined.

First Modification

In the above-mentioned embodiments, the structure in which the reference signal W[i] in the second period Pb[i] becomes a chopping-wave signal has been exemplified. However, the waveform of the reference signal W[i] in the second period Pb[i] may be appropriately changed. For example, in the above-mentioned embodiments, the reference signal W[i] whose waveforms are axisymmetric on the basis of the middle point tc of the second period Pb[i] has been exemplified, but the axisymmetry of the reference signal W[i] is not essential. For example, various waveforms, such as a ramp wave, a sawtooth wave, a multiramp wave (staircase wave), are applied to the reference signal W[i] in the second period Pb[i]. In addition, not only a waveform in which the potential linearly varies but also a waveform, such as a sine wave, in which the potential varies in a curve shape, may be applied to the reference signal W[i] in the second period Pb[i].

Further, in the above-mentioned embodiments, the structure in, which the reference signal W[i] has a waveform of one cycle of the chopping wave in the second period Pb[i] has been exemplified, but continuous waveforms of various unit waveforms, such as the chopping wave, the ramp wave, the sawtooth wave, or the like, in the second period Pb[i] (that is, waveform in which a plurality of unit waveforms are disposed on a time axis such that the increase and the decrease of the potential are repeated many times) may be may be applied to the reference signal W[i]. As such, in the invention, the reference signal W[i] whose potential varies with the time passage in the second period Pb[i] can be properly selected according to the driving type or function of the electro-optical element 35.

Figure 6:
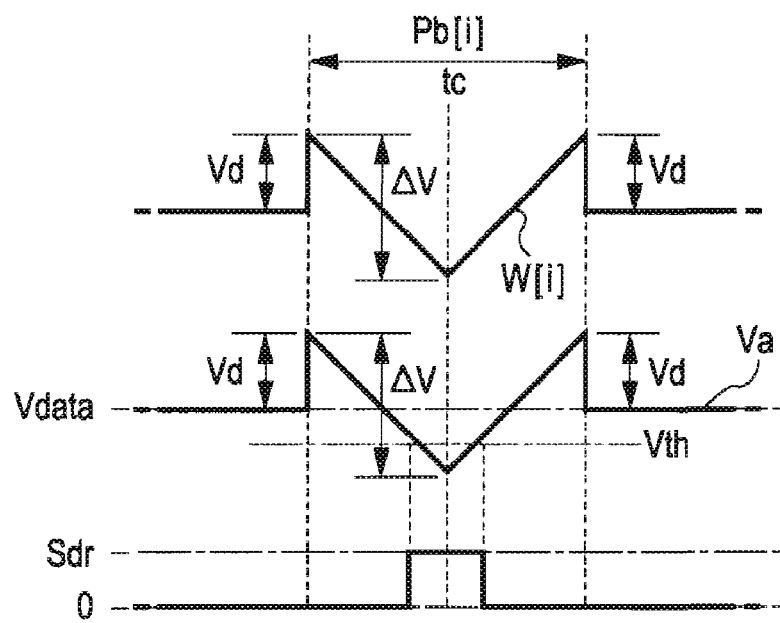
FIG. 6 is a timing chart illustrating a waveform of a reference signal W[i] according to a modification.

Further, in the above-mentioned embodiments, the structure in which if the second period Pb[i] starts, the potential Va of the input terminal T varies from the potential Vdata in the first period Pa[i] has been exemplified, but the waveform of the reference signal W[i] may be selected such that the potential Va of the input terminal T varies in the start point and the end point of the second period Pb[i]. For example, the reference signal W[i] exemplified in FIG. 6 may be used. In FIG. 6, in the reference signal W[i], the potential increases by the variation Vd at the start point of the second period Pb[i], and the potential decreases by the variation Vd at the end point of the second period Pb[i]. Further, similar to the first embodiment, the potential decreases and increases within a range of the voltage ΔV during the period from the start point of the second period Pb[i] to the end point. The potential Va of the input terminal T varies according to the waveform of the reference signal W[i]. That is, as shown in FIG. 6, the potential Va firstly increases by the variation Vd from the potential Vdata at the start point of the second period Pb[i], the potential Va secondly decreases by the variation ΔV in the time interval from the start point to the middle point tc and increases by the variation ΔV in the time interval from the middle point tc to the end point, and the potential thirdly decreases by the variation Vd at the end point of the second period Pb[i] and becomes the potential Vdata. In this structure, in similar to the above-mentioned embodiments, the driving current Sdr is outputted from the inverter 34 over the time length according to the data signal X[j].

Second Modification

Figure 7:
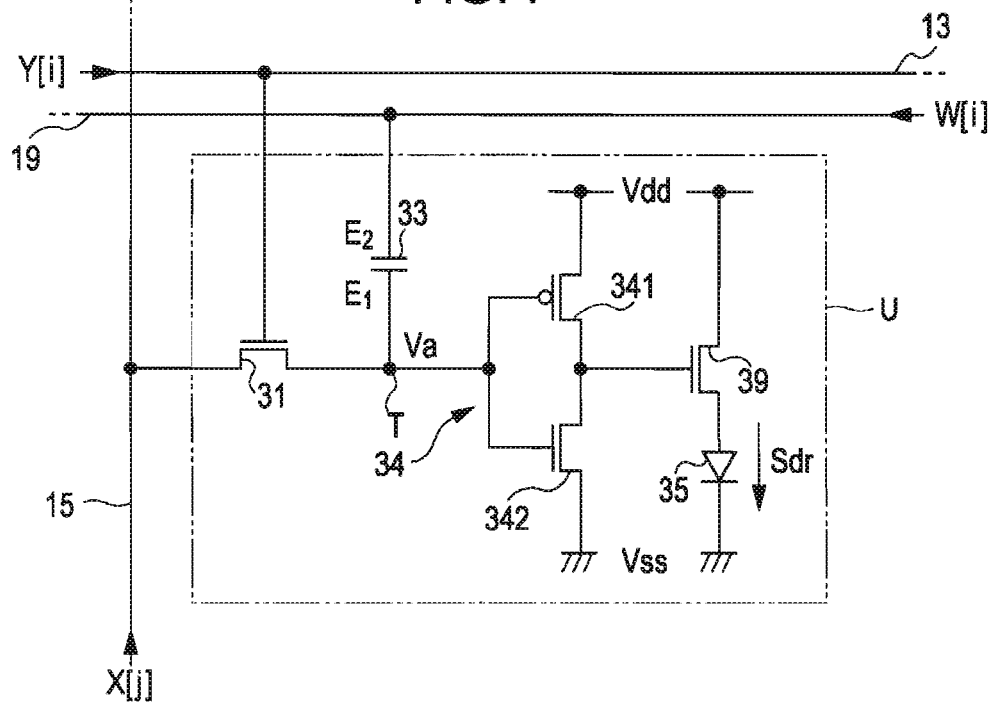
FIG. 7 is a circuit diagram illustrating a structure of a unit circuit according to a modification.

The specific structure of the unit circuit U is not limited to the structure shown in FIG. 3. For example, the conductive type of each transistor is arbitrarily varied from the conductive type exemplified in FIG. 3. Further, in the above-mentioned embodiments, the structure in which the output terminal of the inverter 34 and the anode of the electro-optical element 35 are directly connected to each other has been exemplified. As shown in FIG. 7, the gate of the n-channel-type transistor 39 may be coupled to the output terminal of the inverter 34. The transistor 39 generates the driving current Sdr and it is interposed between the power line supplied with a power supply potential Vdd and the anode of the electro-optical element 35. In a case in which the transistor 341 is turned on and the power supply potential Vdd is outputted from the inverter 34, the transistor 39 is turned on. At this time, the driving current Sdr flows through the electro-optical element 35, and the electro-optical element 35 emits light. In contrast, if the ground potential Vss is outputted from the inverter 34, since the transistor 39 is turned off, the current supply is stopped, and the electro-optical element 35 is turned off. In this structure, it is possible to achieve the same advantages and effects.

Further, the unit for outputting the driving current Sdr (driving unit in the invention) is not limited to the inverter 34. For example, instead of the inverters 34 shown in FIGS. 3, 5, and 7, a comparator may be disposed which compares the potential Va of the input terminal T with the predetermined potential and outputs the driving current Sdr according to the compared result. This comparator outputs the power supply potential Vdd when the potential Va is smaller than the predetermined potential, and outputs the ground potential Vss when the potential Va is greater than the predetermined potential. In this structure, it is possible to achieve the same advantages and effects as the above-mentioned embodiments. Further, the signal that is supplied to the electro-optical element 35 may be a current signal (driving current Sdr exemplified in the above-mentioned embodiments) or a voltage signal. As described above, the driving unit is not limited to an unit having a specific structure so long as it is an element that outputs the driving signal (driving current Sdr or driving voltage) according to the potential Va of the input terminal T (specifically, according to the amplitude difference between the potential Va and the predetermined potential).

Third Modification

In the above-mentioned embodiments, the structure in which the reference signal lines 17 are formed so as to correspond to the plurality of scanning lines 13 (that is, for every row) has been exemplified, but the relationship between the scanning line 13 and the reference signal line 17 is not limited thereto. For example, the m scanning lines 13 may be divided into groups, each of which has scanning lines of the predetermined number, the reference signal lines 17 may be formed so as to correspond to the respective scanning line groups, and each reference signal line 17 may be coupled to the unit circuits U that belong to one group. In this structure, the input of the data signal X[j] is performed for every row, and the driving of the electro-optical element 35 by the variation of the reference signal W[i] is performed for every group.

Fourth Modification

In the second embodiment, the structure in which the input terminal T of the inverter 34 is electrically connected to the output terminal of the inverter 34 before the first period Pa[i] has been exemplified, but the connection destination of the input terminal T of the inverter 34 may be appropriately changed. For example, the transistor 37 may be interposed between the wiring line whose potential is maintained to the predetermined potential and the input terminal T of the inverter 34, and the transistor 37 may be turned on before the first period Pa[i] and the input terminal T of the inverter 34 may be initialized with the predetermined potential.

Fifth Modification

In the abovementioned embodiments, the OLED element has been exemplified as the electro-optical element 35. However, the electro-optical element that is adopted in the electronic device of the invention is not limited thereto. For example, in addition to the OLED element, various self-emission elements, such as an inorganic EL element, a field emission (FE) element, a surface-conduction electron-emitter (SE) element, a ballistic electron surface emitting (BS) element, and a light-emitting diode (LED) element, and various electro-optical elements, such as an electrophoresis element, an electrochromic element, or the like, may be used. Further, the invention may be applied to a sensing device, such as a biochip or the like. In the invention, the driven element is a concept that includes all elements driven by applying an electric energy. The electro-optical element such as the light-emitting element is only an example of the driven element.

Third Embodiment

Figure 8:
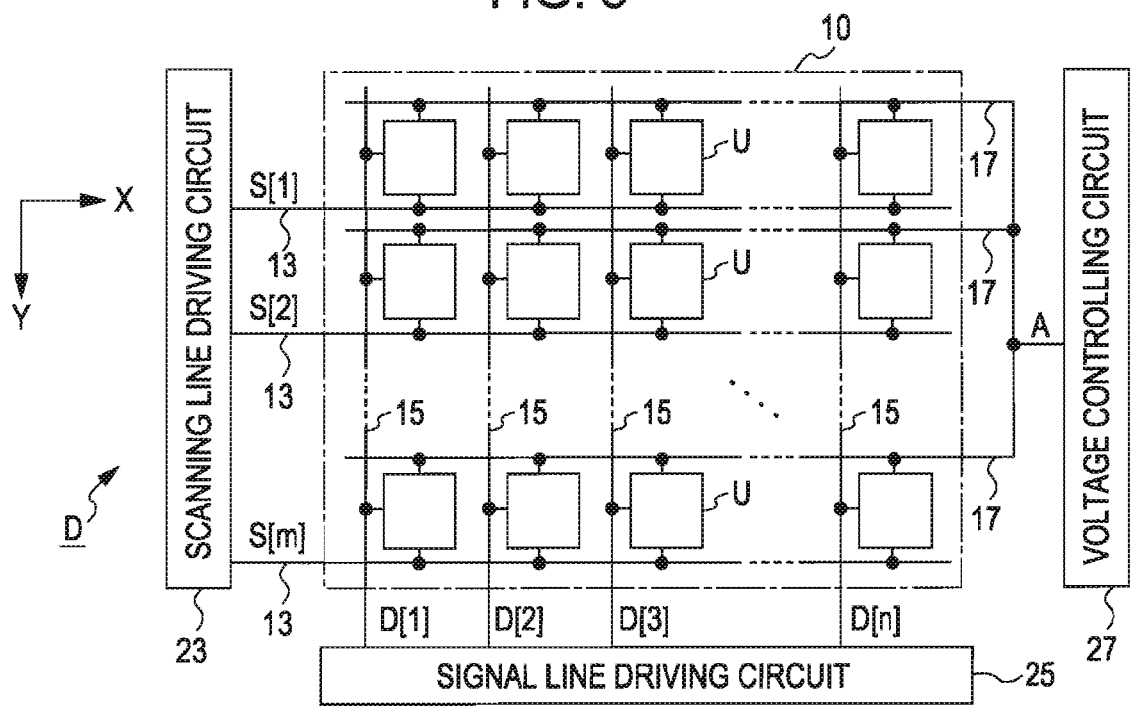
FIG. 8 is a block diagram illustrating a structure of an electronic device according to a third embodiment of the invention.

FIG. 8 is a block diagram illustrating a structure of an electronic device according to a third embodiment of the invention. An electronic device D shown in FIG. 8 is corresponds to an electro-optical device that is used in various electronic apparatuses as an image display device, and includes an element array unit 10 in which a plurality of unit circuits U are two-dimensionally disposed, a scanning line driving circuit 23 and a data ling driving circuit 25 that drive the unit circuits U, and a voltage control circuit 27 that supplies a voltage A to the unit circuits U. In this case, each of the scanning line driving circuit 23, the data line driving circuit 25, and the voltage control circuit 27 may be mounted on the electronic device D as an independent circuit, or a portion or all of these circuits may be mounted on the electronic device D as a single circuit.

As shown in FIG. 8, the element array unit 10 includes m scanning lines 13 that extend in an X direction, and n signal lines 15 (data lines) that extend in an Y direction orthogonal to the X direction (in this case, each of m and n is a natural number). Each of the unit circuits U is disposed at a location that corresponds to an intersection between a scanning line 13 and a signal line 15. Accordingly, the unit circuits U are disposed in a matrix of m rows×n columns.

The element array unit 10 further includes m voltage supply lines 17 that extend in an X direction, each of which forms a couple together with a corresponding scanning line 13. These voltage supply lines 17 are commonly coupled to the output terminal of the voltage control circuit 27. Accordingly, the voltage A that is outputted from the voltage control circuit 27 is commonly supplied to the plurality of unit circuits U through the corresponding voltage supply lines 17.

Figure 9:
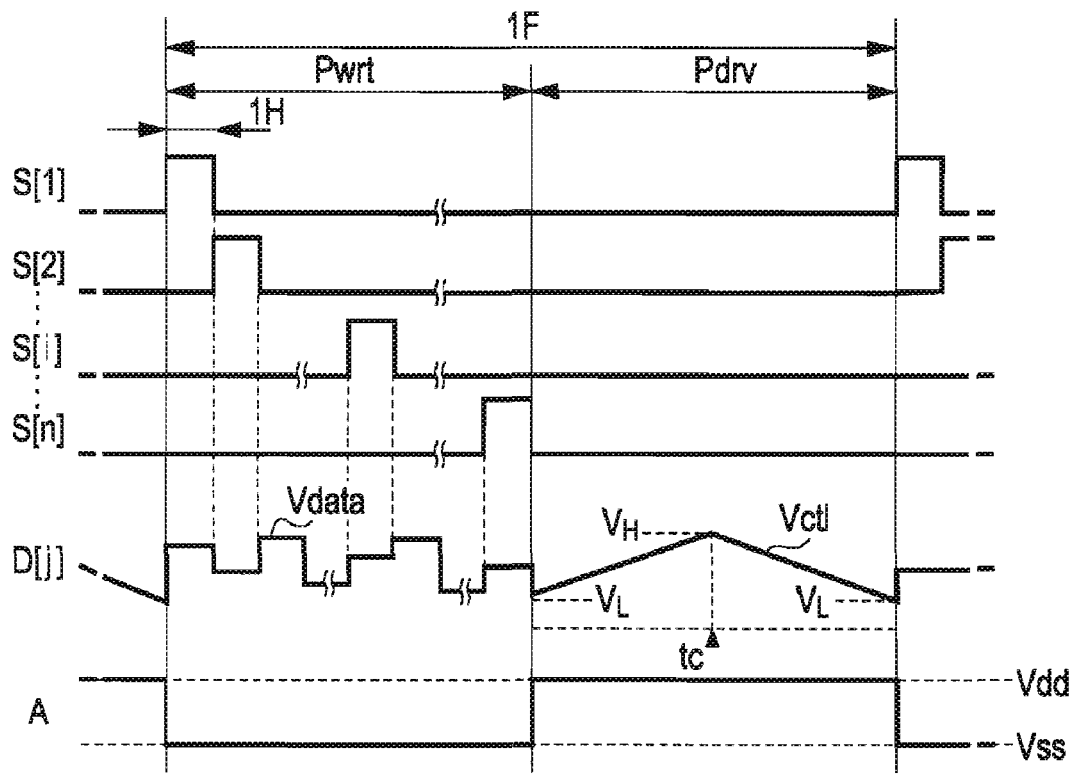
FIG. 9 is a timing chart illustrating an operation of an electronic device.

FIG. 9 is a timing chart illustrating an operation of the electronic device D. As shown in FIG. 9, in the present embodiment, one frame (1F) is divided into a writing period Pwrt and a driving period Pdrv. Further, in the present embodiment, the case in which the time length of the writing period Pwrt and the time length of the driving period Pdrv are substantially equal to each other is exemplified, but the ratio between the time lengths of the writing period and the driving period will be arbitrarily changed.

As shown in FIG. 9, the voltage control circuit 27 sets the voltage A of each voltage supply line 17 to a voltage Vss in the writing period Pwrt, and sets the voltage A to the voltage Vdd in the driving period Pdrv right after the writing period Pwrt. In the present embodiment, the voltage Vss corresponds to a potential (ground potential) the reference voltage of each unit. The voltage Vdd is a voltage higher than the voltage Vss (for example, high power supply potential).

As shown in FIG. 8, the scanning line driving circuit 23 sequentially selects each of the m scanning lines 13 in a predetermined order in the writing period Pwrt (selects the plurality of unit circuits U in a row unit). Specifically, as shown in FIG. 9, the scanning line driving circuit 23 generates scanning signals S[1] to S[m] that sequentially become high levels in each horizontal scanning period (1H) in the writing period Pwrt, and outputs them to the corresponding scanning lines 13. A scanning signal S[i] that is supplied to a scanning line 13 of an i-th row (i is an integer that satisfies the condition, $1 \leq i \leq m$) becomes a high level in an i-th horizontal scanning period (1H) in the writing period Pwrt, and becomes a low level in the other period (including the driving period Pdrv). If a voltage level of the scanning signal S[i] becomes a high level, it means that the i-th row is selected.

In FIG. 8, the signal line driving circuit 25 supplies data signals D[1] to D[n] to unit circuits U of one row (n unit circuits) corresponding to the scanning line 13 selected by the scanning line driving circuit 23 through the corresponding data lines 15. As shown in FIG. 9, a potential of a data signal D[j], which is supplied to a signal line 15 of a j-th column (j is an integer that satisfies the condition $1 \leq j \leq n$), becomes a data voltage Vdata in the writing period Pwrt, and becomes a control voltage Vct1 in the driving period Pdrv.

As shown in FIG. 9, the data voltage Vdata sequentially varies for every horizontal scanning period according to the gray-scale level (luminance) that is designated to each unit circuit U. Specifically, the data voltage Vdata of the signal D[j] becomes a voltage that corresponds to a gray-scale level designated to the unit circuit U of the j-th column that belongs to an i-th row in the i-th horizontal scanning period of the writing period Pwrt. The gray-scale level of each unit circuit U is designated by the gray-scale data supplied from the exterior.

Meanwhile, the control voltage Vct1 temporally varies in the driving period Pdrv. In the present embodiment, the control voltage Vct1 has a chopping wave in which a waveform from a middle point tc (that is, a time point having the same time length from a start point and an end point of the driving period Pdrv) of the driving period Pdrv to a start point and a waveform from the middle point tc to the end point are axisymmetric to each other on the basis of the middle point tc. That is, as shown in FIG. 9, when the time passes, the potential of the control voltage Vct1 linearly increases from the voltage VL to the voltage VH lower than the voltage VL in a time interval from the start point of the driving period Pdrv to the middle point tc of the driving period Pdrv, and linearly decreases from the voltage VH in a time interval from the middle point tc to the end point and reaches the voltage VL again.

Figure 10:
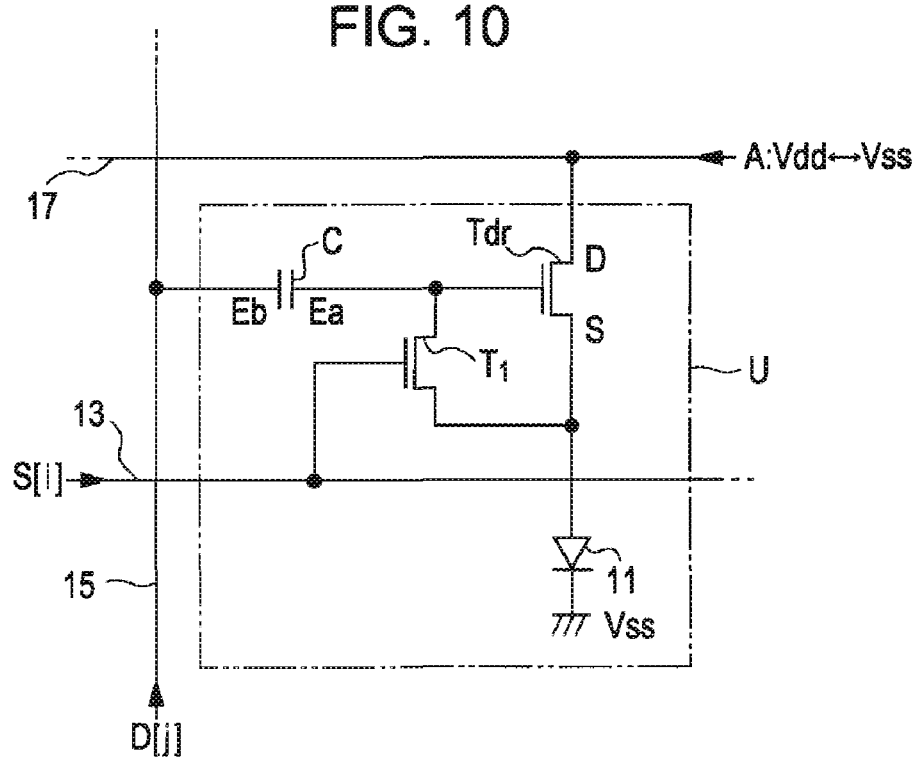
FIG. 10 is a circuit diagram illustrating a structure of one unit circuit.

Next, a specific structure of each of the unit circuits U will be described with reference to FIG. 10. In FIG. 10, only a unit circuit U that is disposed at a location of an i-th row and a j-th column is shown, but the other unit circuits U also have the same structure.

As shown in FIG. 10, each of the unit circuits U has an electro-optical element 11, a driving transistor Tdr, a transistor T1, and a capacitor element C. The electro-optical element 11 corresponds to an element to be driven (driven element) in the electronic device D. In the present embodiment, the electro-optical element 11 corresponds to a current-driver light-emitting element that emits light with a luminance according a current (hereinafter, referred to as 'driving current') that is supplied thereto. In the present embodiment, as the electro-optical element 11, an OLED element having a structure in which a light-emitting layer made of an organic EL (electroluminescent) material is interposed between an anode and a cathode is adopted. The cathodes of the electro-optical elements 11 of the unit circuits U are commonly coupled to a ground (voltage value Vss). The electro-optical element 11 emits light by applying a forward voltage that is greater than the threshold voltage Vth_EL.

The driving transistor Tdr of FIG. 10 is an n-channel-type transistor that controls a current value of the driving current. Specifically, an electrically conductive state between the source and the drain of the driving transistor Tdr varies according to a voltage of a gate Vg (hereinafter, referred to as 'gate voltage'), and the driving transistor Tdr generates a driving current I1 that has a current level according to the gate voltage Vg. Accordingly, the electro-optical element 11 is driven with the luminance according to the conductive state of the driving transistor Tdr (that is, luminance according to the gate voltage Vg).

In the present embodiment, since the amplitudes of the voltages at the source and the drain of the driving transistor Tdr are sequentially inverted, the drain and the source of the driving transistor Tdr are changed with time passage. However, in the description below, on the basis of the amplitudes of the voltages of the terminals of the driving transistor Tdr when the driving current I1 is supplied to the electro-optical element 11 through the driving transistor Tdr, for convenience of description, the terminal of the driving transistor Tdr at the electro-optical element 11 side is denoted by a 'source (S)', and the terminal of the counter side is denoted by a 'drain (D)'.

The driving transistor Tdr is interposed between the electro-optical element 11 and the voltage supply line 17. That is, the drain of the driving transistor Tdr is coupled to the voltage supply line 17, and the source of the driving transistor Tdr is coupled to the anode of the electro-optical element 11. The source of the driving transistor Tdr is directly connected to the electro-optical element 11. That is, a switching element is not interposed on a path of the driving current I1 ranging from the source of the driving transistor Tdr to the anode of the electro-optical element 11.

The transistor T1 corresponds to an n-channel-type transistor that is interposed between the gate and the source of the driving transistor Tdr and controls electrical connection between the gate and the source of the driving transistor Tdr. The gate of the transistor T1 is coupled to the scanning line 13. Accordingly, in a period (i-th horizontal scanning period) in which the scanning signal S[i] maintains a high level, the transistor T1 is turned on, and the driving transistor Tdr is diode-connected. If the scanning signal S[i] is shifted from a high level to a low level, the transistor T1 is turned off, and the diode-connection of the driving transistor Tdr is released.

As shown in FIG. 10, the capacitor element C includes a first electrode Ea and a second electrode Eb that are opposite to each other, and a dielectric that is interposed between the electrodes. The first electrode Ea is coupled to the gate of the driving transistor Tdr. The second electrode Eb is coupled to the signal line 15. The capacitor element C holds a charge according to the potential difference between the first electrode Ea and the second electrode Eb (that is, potential difference between the signal line 15 and the gate of the driving transistor Tdr).

Next, a specific operation of the electronic device D will be described with reference to FIGS. 11 and 12. In the description below, the operation of the unit circuit U of the j-th column that belongs to the i-th row will be described while dividing the period of the operation into the writing period Pwrt and the driving period Pdrv.

Figure 11:
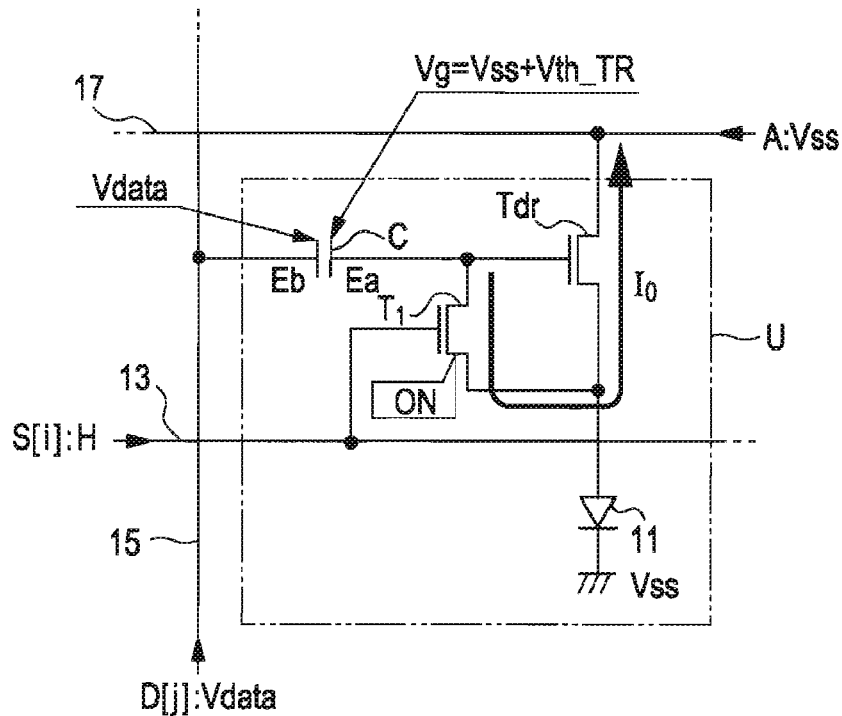
FIG. 11 is a circuit diagram illustrating an aspect of a unit circuit in a writing period.

Writing Period Pwrt (FIG. 11)

In the writing period Pwrt, if the level of the scanning signal S[i] is shifted from a low level to a high level, the transistor T1 is turned on, and the source and the gate of the driving transistor Tdr are electrically connected to each other (diode-connected). In the meantime, in the writing period Pwrt, the voltage A of the voltage supply line 17 maintains the voltage value Vss. That is, since the voltage A of the voltage supply line 17 becomes lower than the voltage value of the source or the gate of the driving transistor Tdr, in the writing period Pwrt, as shown in FIG. 11, the current I0 sequentially flows from the gate of the driving transistor Tdr to the voltage supply line 17 via the transistor T1 and the source and drain of the driving transistor Tdr.

In the present embodiment, the structures or materials of the electro-optical element 11 and the driving transistor Tdr are selected such that threshold voltage Vth_EL of the electro-optical element 11 becomes greater than the threshold voltage Vth_TR of the driving transistor Tdr. That is, in the writing period Pwrt, the voltage of the source of the driving transistor Tdr (Vss+Vth_TR) is smaller than the threshold voltage Vth_EL of the electro-optical element 11. Accordingly, in the writing period Pwrt, the current does not flow through the electro-optical element 11, and thus the electro-optical element 11 is turned off.

As described above, if the current I0 flows through the driving transistor Tdr, the gate voltage Vg of the driving transistor Tdr (that is, voltage of the first electrode Ea) becomes a voltage that corresponds to a sum (Vss+Vth_TR) between the voltage Vss and the threshold voltage Vth_TR of the driving transistor Tdr in the horizontal scanning period in which the scanning signal S[i] maintains a high level. Meanwhile, in the horizontal scanning period, the data voltage Vdata of the signal D[j] is supplied to the first electrode Ea. In a state in which the above-mentioned voltage relationship is maintained, if the horizontal scanning period passes and the scanning signal S[i] is shifted from a high level to a low level, the transistor T1 is turned off, and the first electrode Ea of the capacitor element C enters a floating state. Accordingly, the potential difference between the first electrode Ea (Vss+Vth_TR) and the second electrode Eb (Vdata) when the scanning signal S[i] is shifted from a high level to a low level is held in the capacitor element C.

In the writing period Pwrt, as described above, the operation for accumulating the charges according to the data voltage Vdata and the threshold voltage Vth_TR in the capacitor element C is sequentially repeated for every horizontal scanning period with respect to all the unit circuits U from the first row to the n-th row.

Figure 12:
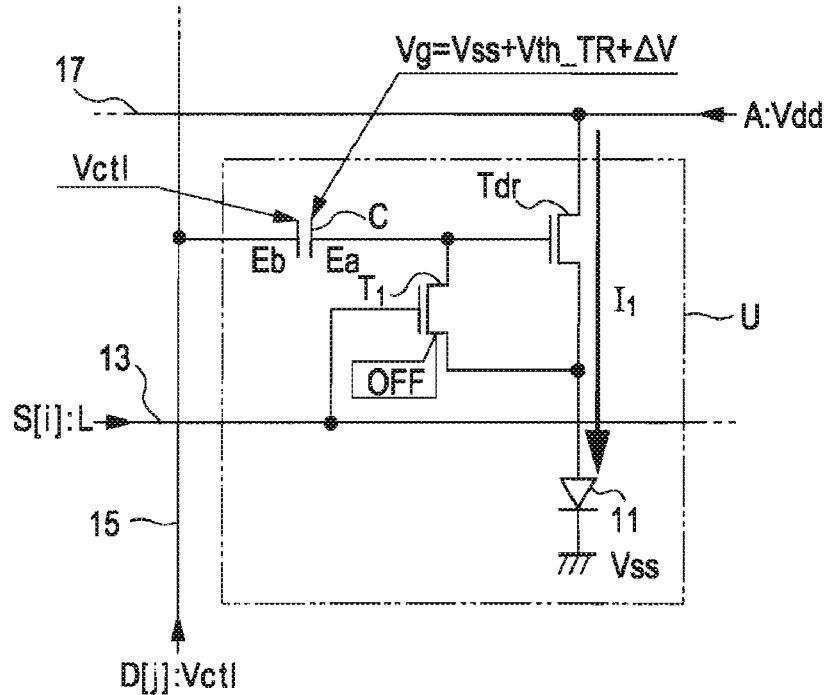
FIG. 12 is a circuit diagram illustrating an aspect of a unit circuit in a driving period.

Driving Period Pdrv (FIG. 12)

In the driving period Pdrv, since each of the scanning signals S[1] to S[m] maintains a low level, the transistors T1 of all the unit circuits U are turned off, and the diode-connection of the driving transistor Tdr is released. Therefore, the first electrodes Ea of the capacitors C in all the unit circuits U maintain a floating state. Meanwhile; in the driving period Pdrv, the voltage control circuit 27 maintains the voltage A of the voltage supply line 17 at the voltage Vdd.

In this state, to the second electrode Eb of the capacitor element C of each unit circuit U, the control voltage Vct1 that temporally varies is supplied through each signal line 15. In this case, since the first electrode Ea is in a floating state, the gate voltage Vg (that is, voltage of the first electrode Ea) of the driving transistor Tdr varies by the voltage $\Delta V$ according to the variation of the voltage of the second electrode Eb by capacitive coupling of the capacitor element C. The relationship between the variation of the voltage of the first electrode Ea and the driving current I1 is as follows.

First, if the control voltage Vct1 applied to the second electrode Eb in the driving period Pdrv is higher than the data voltage Vdata applied in the writing period Pwrt right before the driving period Pdrv, the gate voltage Vg of the driving transistor Tdr (voltage of the first electrode Ea) increases by the voltage $\Delta V$ that corresponds to the difference between the control voltage Vct1 and the data voltage Vdata from the voltage (Vss+Vth_TR) set in the writing period Pwrt. At this time, since the driving transistor Tdr is turned on (conductive state), as shown in FIG. 12, the driving current I1 is supplied from the voltage supply line 17 to the electro-optical element 11 via the driving transistor Tdr. In addition, the electro-optical element 11 emits light by supplying the driving current I1.

Meanwhile, if the control voltage Vct1 applied to the second electrode Eb in the driving period Pdrv is lower than the data voltage Vdata applied in the writing period Pwrt right before the driving period Pdrv, the gate voltage Vg of the driving transistor Tdr decreases by the voltage $\Delta V$ that corresponds to the difference between the control voltage Vct1 and the data voltage Vdata from the voltage (Vss+Vth_TR) set in the writing period Pwrt. At this time, since the driving transistor Tdr is turned off (non-conductive state), a path ranging from the voltage supply line 17 to the electro-optical element 11 is blocked, and thus the electro-optical element 11 is turned off.

As such, in the driving period Pdrv, the driving transistor Tdr of each unit circuit U is turned on in a period in which the control voltage Vct1 becomes higher than the data voltage Vdata, and it is turned off in a period in which the control voltage Vct1 becomes lower than the data voltage Vdata. That is, the electro-optical element 11 of each unit circuit U emits light in a period of the driving period Pdrv which has a time length according to the voltage value of the data voltage Vdata, and it is turned off in a remaining period of the driving period Pdrv. Accordingly, each electro-optical element 11 is controlled by a gray-scale level (integration value of the luminance in the driving period Pdrv) according to the data voltage Vdata (control a gray-scale level by pulse width modulation).

As described above, in the present embodiment, in the writing period Pwrt, the gate voltage Vg of the driving transistor Tdr is set to the voltage according to the threshold voltage Vth_TR. That is, the driving transistor Tdr compulsorily enters an intermediate state between the conductive state and the non-conductive state regardless of the amplitude of the threshold voltage Vth_TR. Accordingly, in the driving period Pdrv, the time length in which the driving transistor Tdr is tuned on and the driving current I1 is supplied to the electro-optical element 11 is determined according to the data voltage Vdata, and does not depend on the threshold value Vth_TR of the driving transistor Tdr. That is, according to the present embodiment, it is possible to control the electro-optical element 11 with a predetermined gray-scale level in high precision by compensating for the error (difference with a designed value) of the threshold voltage Vth_TR of the driving transistor Tdr.

Further, in the present embodiment; the total number of the transistors included in one unit circuit U is 'two'. Accordingly, as compared to the structure disclosed in JP-A-2003-122301 in which at least three transistors are essentially provided for one unit circuit so as to compensate for the variation of the threshold voltage of the driving transistor Tdr, the structure of the electronic device D can be simplified, and the manufacturing cost can be reduced. Further, it is possible to increase an opening ratio of each unit circuit U (a ratio of a region where the light is emitted from the electro-optical element 11 to a region where the unit circuit U is distributed).

Meanwhile, as each transistor (in particular, driving transistor Tdr) that forms the unit circuit U, a thin-film transistor in which a polycrystalline silicon, a microcrystalline silicon, a single-crystal silicon or an amorphous silicon is used as a material for forming a semiconductor layer or a transistor made of a bulk silicon can be formed. Of these transistors, in the transistor in which the semiconductor layer is formed of amorphous silicon, if the direction of the current flowing through the transistor is constantly fixed, the threshold voltage temporally varies.

Even in the structure of the present embodiment, in the driving period Pdrv, the driving current I1 flows from the drain of the driving transistor Tdr to the source, and in the writing period Pwrt, the current I0 flows from the source to the drain, as shown in FIG. 11. That is, the direction of the current that flows through the driving transistor Tdr is opposite between the writing period Pwrt and the driving period Pdrv. Accordingly, according to the present embodiment, in the structure in which the thin-film transistor in which the semiconductor layer is made of amorphous silicon is adopted in the driving transistor Tdr, it is possible to suppress the threshold voltage Vth_TR from temporally varying.

Fourth Embodiment

Next, a fourth embodiment of the invention will be described.

In the third embodiment, in the writing period Pwrt, the voltage A of the voltage supply line 17 is reduced to the voltage Vss so as to generate the current I0, and thus the gate voltage Vg of the driving transistor Tdr becomes the voltage (Vss+Vth_TR) according to the threshold voltage Vth_TR. However, if the voltage of the source of the driving transistor Tdr is accidentally reduced to the voltage Vss or less due to the external disturbance such as a noise, even though the voltage A is reduced to the voltage Vss, the current I0 is not generated. As a result, the gate voltage Vg may not become the voltage according to the threshold voltage Vth_TR. In order to solve these problems, in the present embodiment, the voltage of the source of the driving transistor Tdr is compulsorily set to the voltage that is capable of generating the current I0. In the present embodiment, the same constituent elements as the third embodiment are denoted by the same reference numerals, and the description thereof will be appropriately omitted.

Figure 13:
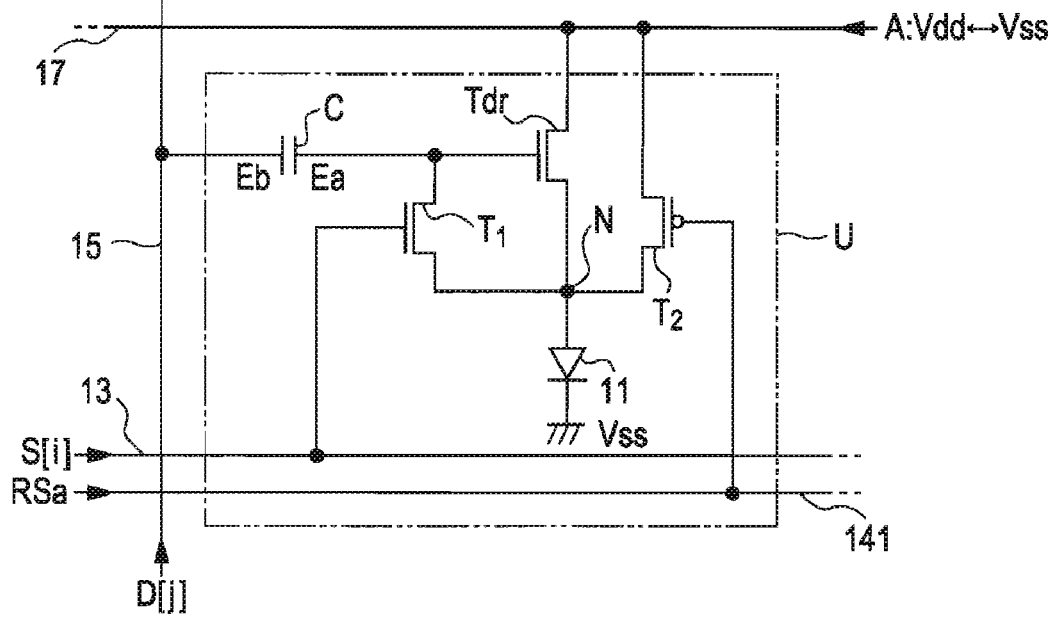
FIG. 13 is a circuit diagram illustrating a structure of a unit circuit according to a fourth embodiment of the invention.

FIG. 13 is a circuit diagram illustrating a structure of a unit circuit U in the present embodiment. As shown in FIG. 13, the unit circuit U of the present embodiment further includes a p-channel-type transistor T2, in addition to the elements shown in FIG. 10. The transistor T2 sets the voltage Vn at the connection node N (source of the driving transistor Tdr or anode of the electro-optical element 11) between the driving transistor Tdr and the electro-optical element 11 to the voltage Vdd, and it is inserted between the connection node N and the voltage supply line 17. The gate of the transistor T2 is coupled to the reset signal line 141 that forms a couple together with the corresponding scanning line 13 and extends in an X direction. The reset signal lines 141 of each row are supplied with a common reset signal RSa from the scanning line driving circuit 23. The circuit that generates the reset signal RSa and outputs it to each reset signal line 141 may be provided so as to be separated from the scanning line driving circuit 23.

Figure 14:
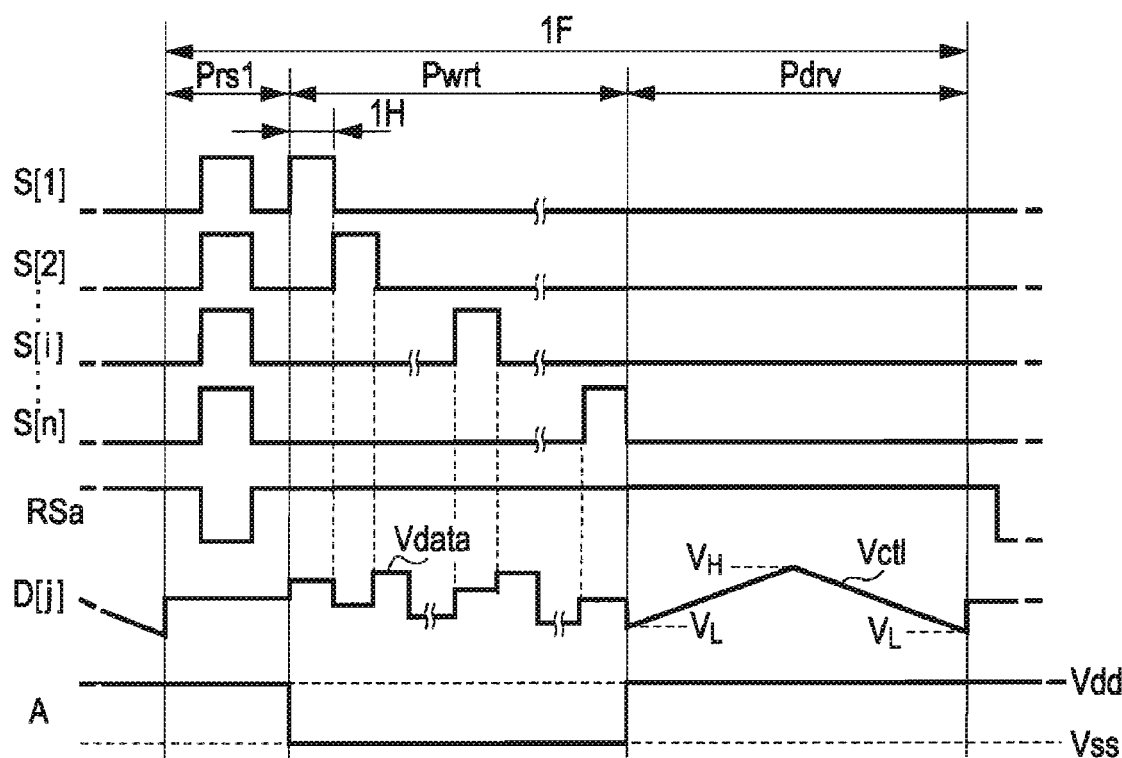
FIG. 14 is a timing chart illustrating an operation of an electronic device according to a fourth embodiment of the invention.

Next, FIG. 14 is a timing chart illustrating an operation of the electronic device D according to the present embodiment. As shown in FIG. 14, one frame (1F) includes not only the writing period Pwrt and the driving period Pdrv but also an initialization period Prs1 right before the writing period Pwrt. The voltage A of each voltage supply line 17 is set to a voltage Vss in the writing period Pwrt, and it is set to the voltage Vdd in the initialization period Prs1 and the driving period Pdrv.

The reset signal RSa that is supplied to each reset signal line 141 becomes a low level in the initialization period Prs1, and maintains a high level in the other period (writing period Pwrt or driving period Pdrv). Further, the scanning line driving circuit 23 allows all the scanning signals S[1] to S[m] to simultaneously become a high level in the initialization period Prs1. The waveforms of the scanning signals S[1] to S[m] in the writing period Pwrt or the driving period Pdrv are the same as those in the first embodiment.

Figure 15:
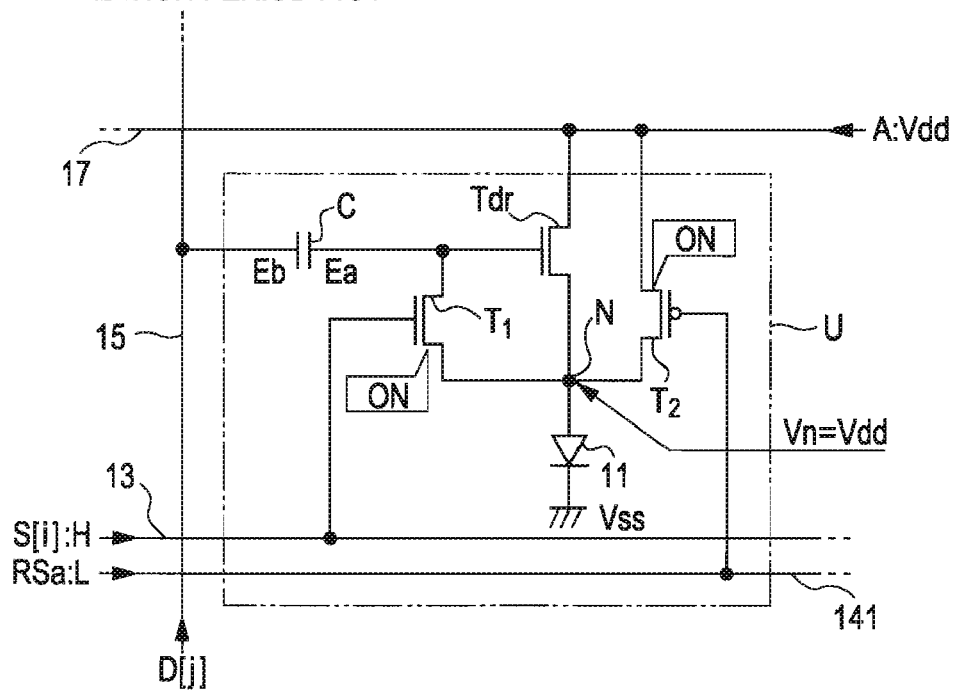
FIG. 15 is a circuit diagram illustrating an aspect of a unit circuit in an initialization period.

FIG. 15 is a circuit diagram illustrating an aspect of one unit circuit U in the initialization period Prs1. As shown in FIG. 15, in the initialization period Prs1, the transistor T1 maintains an on state by the scanning signal S[i] of a high level, and the transistor T2 maintains an on state by the reset signal RSa of the low level. That is, the connection node N and the gate of the driving transistor Tdr are electrically connected to the voltage supply line 17 through the transistor T2. At this time, the voltage A of the voltage supply line 17 is set to the voltage Vdd. Accordingly, in the initialization period Prs1, as shown in FIG. 15, the voltage Vn of the connection node N and the gate voltage Vg of the driving transistor Tdr are compulsorily set to the voltage Vdd. Since the transistors T1 and T2 are turned on, the initialization period Prs1 is set to have a sufficient time length in which the voltage Vn of the connection node N can reach the voltage Vdd.

The operations in the writing period Pwrt and the driving period Pdrv are the same as those in the third embodiment. According to the present embodiment, in the initialization period Prs1 right before the writing period Pwrt, the voltage Vn of the connection node N is set to the voltage Vdd higher than the sum between the voltage Vss of the voltage supply line 17 and the threshold voltage Vth_TR of the driving transistor Tdr in the writing period Pwrt. Accordingly, even though the voltage Vn is reduced to the voltage Vss or less before the initialization period Prs1, it is possible to allow the current I0 to flow from the driving transistor Tdr toward the voltage supply line 17 in the writing period Pwrt. Accordingly, according to the present embodiment, in addition to the same effects as the first embodiment, it is possible to perform a stable operation by reducing the influence of the external disturbance, such as the noise.

In the initialization period Prs1, since the voltage Vdd of the voltage Vn is greater than the threshold voltage Vth_EL, the electro-optical element 11 emits light. However, if the time length of the initialization period Prs1 is shorter than that in the writing period Pwrt or the driving period Pdrv, the light emission of the electro-optical element 11 in the initialization period Prs1 does not affect the gray-scale level that is recognized by a viewer. Further, in the present embodiment, the case in which the initialization period Prs1 is set right before the writing period Pwrt has been exemplified, but the timing of the initialization period Prs1 is arbitrarily set. For example, the initialization period Prs1 may be set for a plurality of frames, and the voltage Vn may be initialized.

Figure 16:
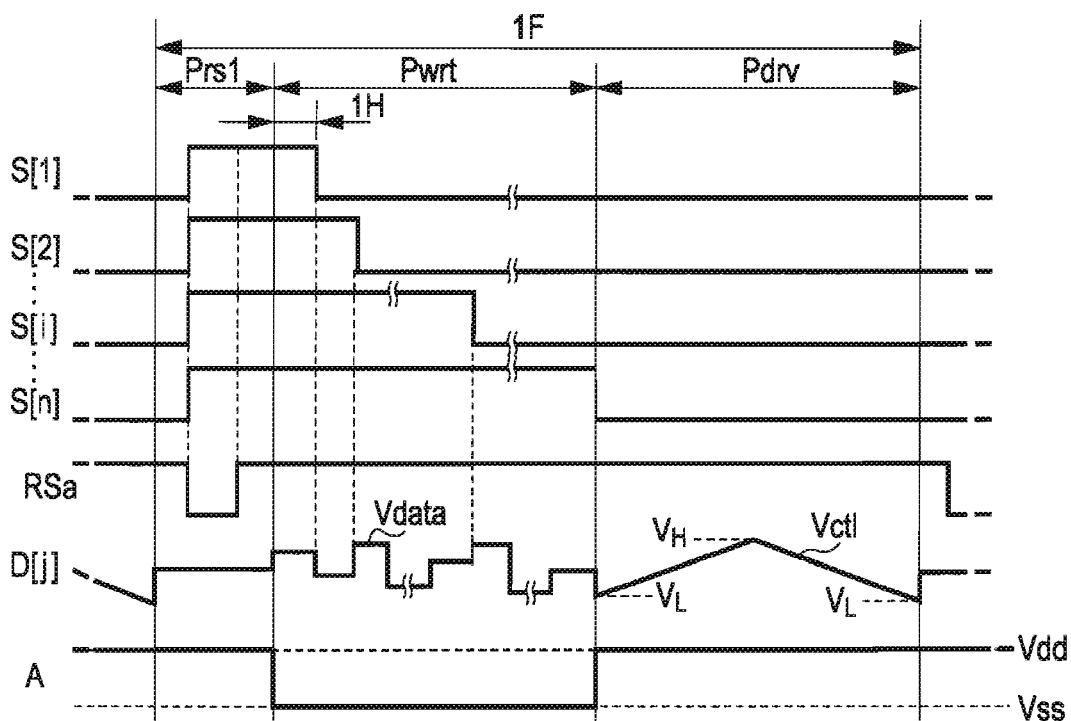
FIG. 16 is a timing chart illustrating an operation according to a modification of a fourth embodiment.

As shown in FIG. 16, in the time interval from the time point which rises to a high level in the initialization period Prs1 to a time point which falls to a low level in an end point of the i-th horizontal scanning period, the scanning signal S[i] may maintain a high level. The quantity of charge that is held in the capacitor element C of the unit circuit U of the i-th row is fixed at a time point when the scanning signal S[i] has fallen to a low level (that is, end point of the i-th horizontal scanning period). Accordingly, even in the driving method shown in FIG. 16, similar to the third embodiment or the present embodiment, it is possible to control the electro-optical element 11 with a gray-scale level according to the data voltage Vdata while compensating for the error of the threshold voltage Vth_TR. Further, according to the method of FIG. 16, as compared with the method of FIG. 14, since the number of times when the level of the scanning signal S[i] varies is reduced it is possible to reduce the power consumed in the scanning line driving circuit 23. Meanwhile, according to the method of FIG. 14, it is possible to allow the pulse width of the scanning signal S[i] in each of the initialization period Prs1 and the writing period Pwrt to have the same value over all the rows. Therefore, the configuration for generating the scanning signal S[i] can be simplified.

Fifth Embodiment

Next, a fifth embodiment of the invention will be described.

In the fourth embodiment, the structure in which the voltage supply line 17 is also used so as to set the voltage Vn of the connection node N to the voltage Vdd has been exemplified. However, in the present embodiment, the connection node N is electrically connected to the wiring line that is separated from the voltage supply line 17, and the voltage Vn is compulsorily set to the predetermined value. Further, in the present embodiment, the same constituent elements as the third embodiment are denoted by the same reference numerals, and the description thereof will be appropriately omitted.

Figure 17:
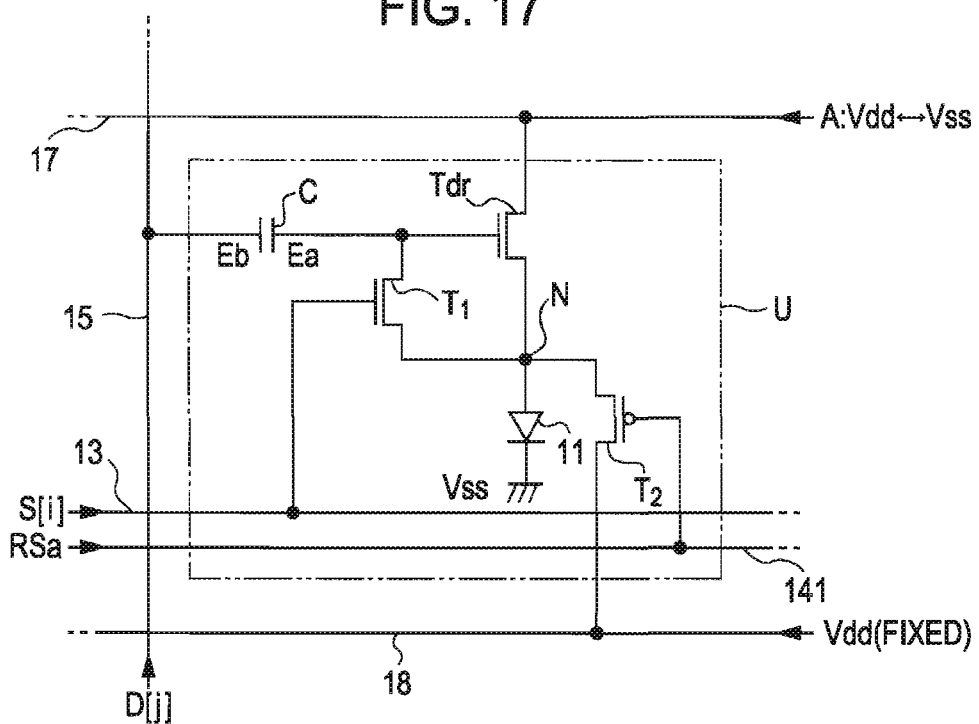
FIG. 17 is a circuit diagram illustrating a structure of a unit circuit according to a fifth embodiment of the invention.

FIG. 17 is a circuit diagram illustrating a structure of the unit circuit U according to the present embodiment. Similar to the fourth embodiment, the unit circuit U of the present embodiment includes a transistor T2 that sets the voltage Vn of the connection node N to the predetermined value (in this case, Vdd). The transistor T2 is interposed between the connection node N and the power line 18. The power line 18 is a wiring line that forms a couple together with the corresponding scanning line 13 and extends in an X direction. The voltage of the power line 18 of each row is always fixed to the voltage Vdd by the voltage control circuit 27. Further, the circuit for supplying the voltage Vdd to the power line 18 may be disposed so as to be separated from the voltage control circuit 27. The gate of the transistor T2 is coupled to the reset signal line 141, similar to the fourth embodiment.

Figure 18:
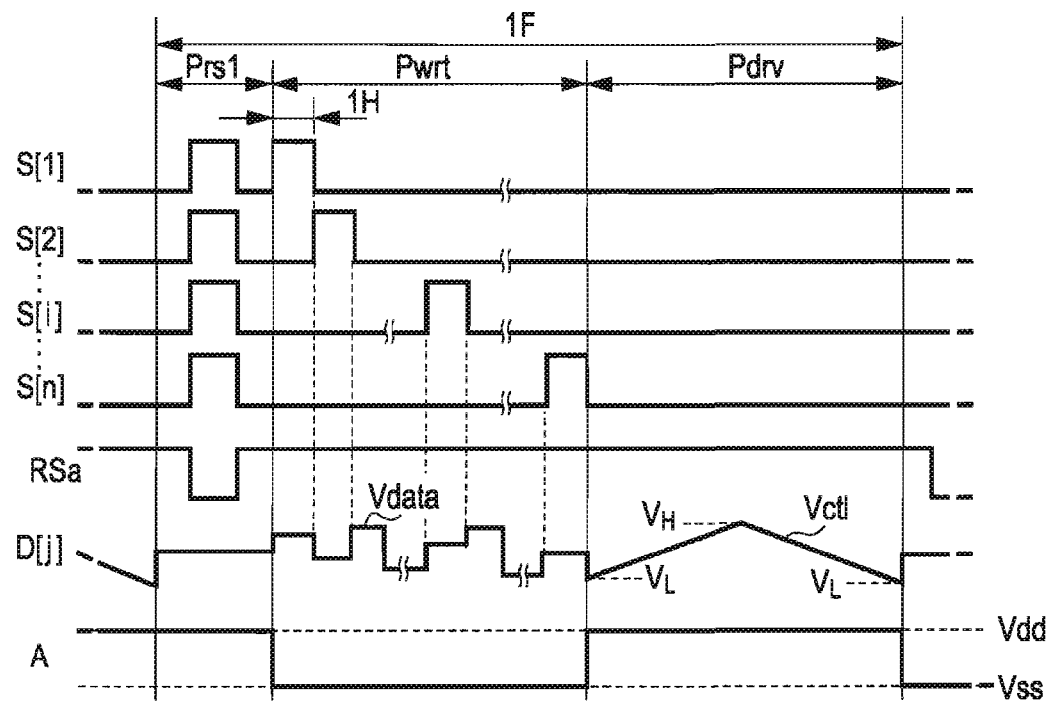
FIG. 18 is a timing chart illustrating an operation of an electronic device according to a fifth embodiment of the invention.

FIG. 18 is a timing chart illustrating an operation of the electronic device D of the present embodiment. Similar to the fourth embodiment, one frame (1F) in the present embodiment includes not only the writing period Pwrt and the driving period Pdrv but also an initialization period Prs1 right before the writing period Pwrt. The voltage A of each voltage supply line 17 is set to the voltage Vdd in the driving period Pdrv, and it is set to the voltage Vss in the initialization period Prs1 and the writing period Pwrt. Meanwhile, the waveforms of the scanning signal S[i] and the reset signal RSa are the same as those in the fourth embodiment (FIG. 14). However, the scanning signals S[1] to S[m] that have the waveforms shown in FIG. 16 may be adopted.

Figure 19:
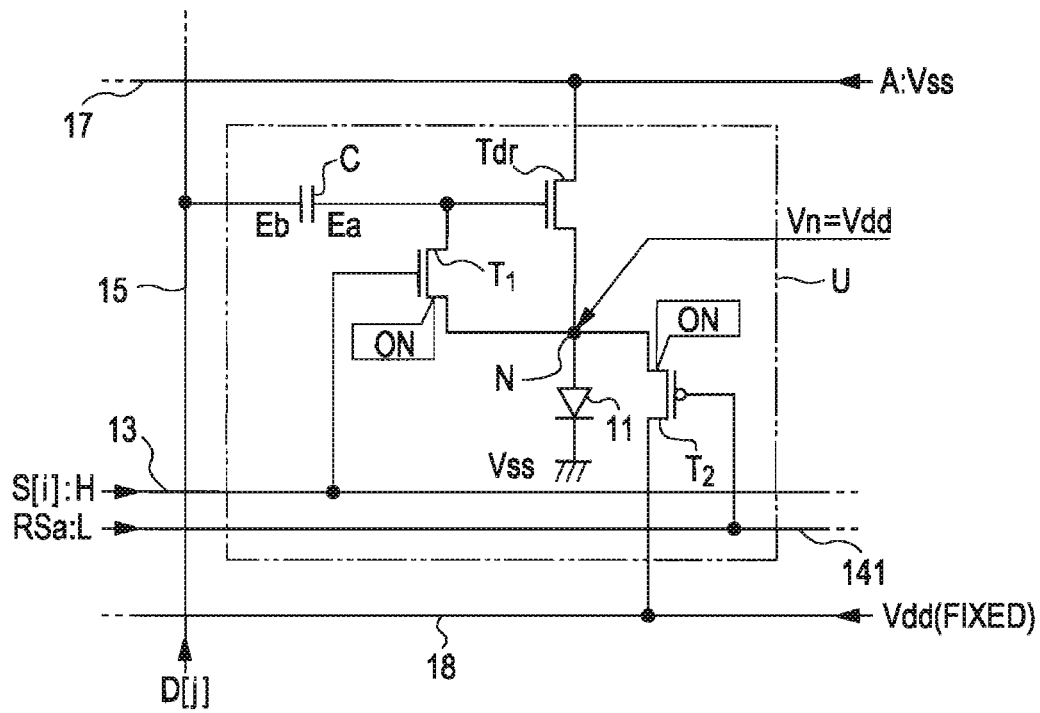
FIG. 19 is a circuit diagram illustrating an aspect of a unit circuit in an initialization period.

FIG. 19 is a circuit diagram illustrating an aspect of one unit circuit U in the initialization period Prs1. As shown in FIG. 19, if the transistor T1 and the transistor T2 are turned on in the initialization period Prs1, the connection node N and the gate of the driving transistor Tdr are electrically connected to the power line 18 through the transistor T2. Since the voltage of the power line 18 is fixed to the voltage Vdd, in the initialization period Prs1, as shown in FIG. 19, the voltage Vn of the connection node N and the gate voltage Vg of the driving transistor Tdr are compulsorily set to the voltage Vdd. Accordingly, even in the present embodiment, it is possible to achieve the same effects as the fourth embodiment.

In addition, in the present embodiment, the voltage A of the voltage supply line 17 in the initialization period Prs1 can be set to the voltage Vss. Different from the fourth embodiment, in order to set the voltage at the connection node N to the voltage Vdd in the initialization period Prs1, the power line 18 is formed so as to be separated from the voltage supply line 17. As such, in the present embodiment, since the voltage supply line 17 is set to the voltage Vss in the initialization period Prs1 (see FIG. 19), the driving current I1 is not supplied to the electro-optical element 11 in the initialization period Prs1. That is, as shown in FIG. 18, the voltage A of the voltage supply line 17 is reduced to the voltage Vss at the end point of the driving period Pdrv, and the thus light emission of the electro-optical element 11 is stopped. Accordingly, according to the present embodiment, as compared with the fourth embodiment in which the electro-optical element 11 can emit light even in the initialization period Prs1, the period in which the electro-optical device 11 emits light is defined in high precision, and each electro-optical element 11 can be controlled with a predetermined gray-scale level. According to the fourth embodiment, since the voltage supply line 17 is also used so as to set the voltage Vn of the connection node N to the voltage Vdd, the power line 18 that is exclusively used in initializing the voltage Vn is not necessary. Accordingly, the structure of the unit circuit U can be simplified.

Sixth Embodiment

Next, a sixth embodiment of the invention will be described.

In the third embodiment, the charge that is accumulated in the capacitor element C in the writing period Pwrt exists until the start point of the writing period Pwrt in a next frame. Accordingly, the quantity of charge (gate voltage Vg) that is accumulated in the capacitor element C in a writing period Pwrt of any frame may be affected by the quantity of charge held in the capacitor element C in the writing period Pwrt of a frame right before the corresponding frame. Accordingly, in the present embodiment, before the writing period Pwrt, the gate voltage Vg of the driving transistor Tdr is compulsorily set to the predetermined value. In the present embodiment, the same constituent elements as the first embodiment are denoted by the same reference numerals, and the description thereof will be appropriately omitted.

Figure 20:
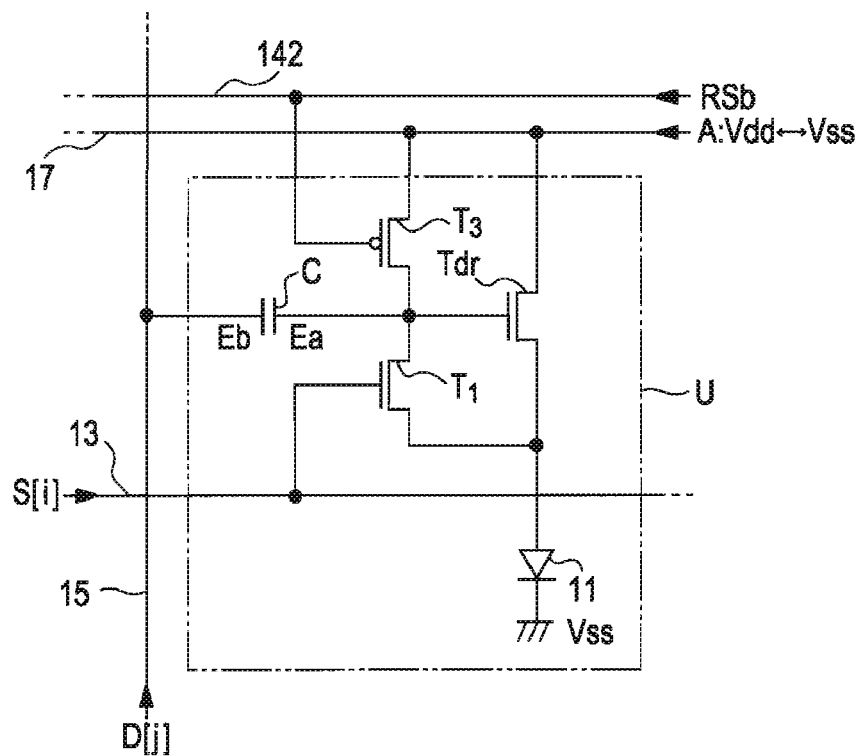
FIG. 20 is a circuit diagram illustrating a structure of a unit circuit according to a sixth embodiment of the invention.

FIG. 20 is a circuit diagram illustrating a structure of a unit circuit U according to the present embodiment. As shown in FIG. 20, the unit circuit U of the present embodiment further includes a p-channel-type transistor T3, in addition to the elements shown in FIG. 10. The transistor T3 sets the gate voltage Vg of the driving transistor Tdr to the voltage Vdd, and it is inserted between the voltage supply line 17 and the gate of the driving transistor Tdr. The gate of the transistor T3 is coupled to the reset signal line 142 that extends in an X direction. The reset signal lines 142 of each row are supplied with a common reset signal RSb from the scanning line driving circuit 23. The circuit that generates the reset signal RSb and outputs it to each reset signal line 142 may be disposed so as to be separated from the scanning line driving circuit 23.

Figure 21:
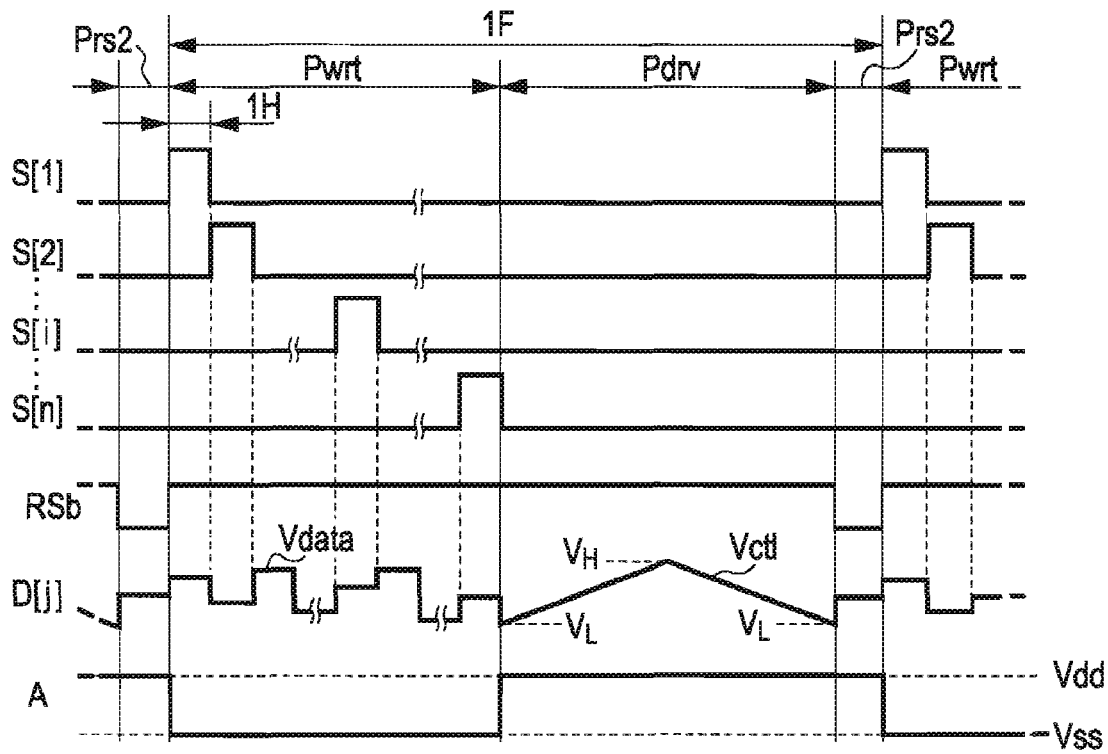
FIG. 21 is a timing chart illustrating an operation of an electronic device according to a sixth embodiment of the invention.

FIG. 21 is a timing chart illustrating an operation of the electronic device D according to the present embodiment. As shown in FIG. 21, each frame includes an initialization period Prs2 right before the writing period Pwrt. Similar to the second embodiment, the voltage A of each voltage supply line 17 is set to a voltage Vss in the writing period Pwrt, and it is set to the voltage Vdd in the initialization period Prs2 and the driving period Pdrv. Meanwhile, the reset signal RSb is shifted from a high level to a low level in the initialization period Prs2, and maintains the high level in the other period. Further, the waveforms of the scanning signals S[1] to S[m] are the same as those in the first embodiment.

Figure 22:
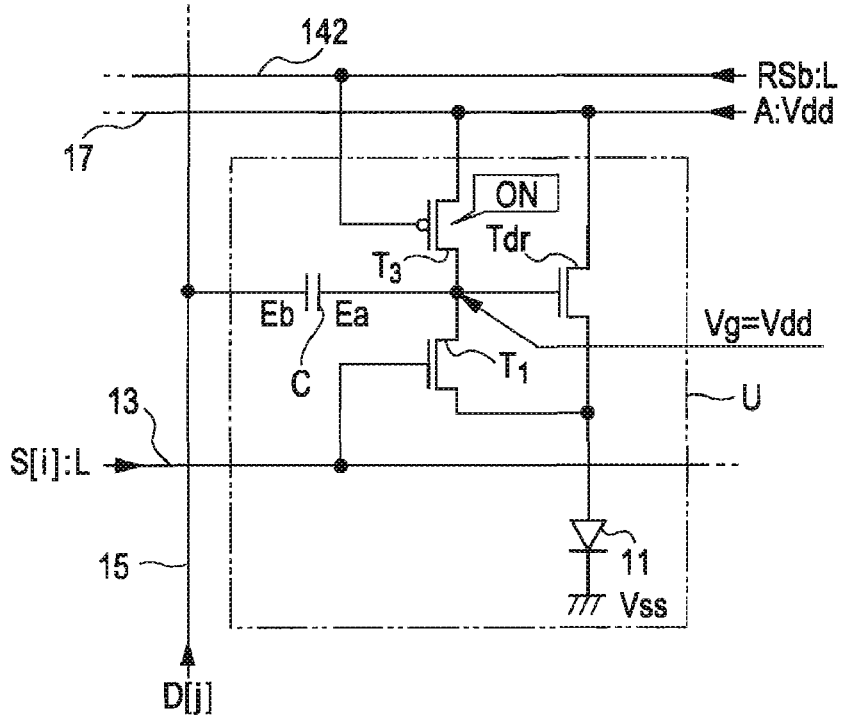
FIG. 22 is a circuit diagram illustrating an aspect of a unit circuit in an initialization period.

FIG. 22 is a circuit diagram illustrating an aspect of a unit circuit U in the initialization period Prs2. As shown in FIG. 22, in the initialization period Prs2, since the reset signal RSb is shifted from a high level to a low level, the transistor T3 is turned on, and the gate of the driving transistor Tdr and the voltage supply line 17 are electrically connected to each other. Accordingly, the gate voltage Vg of the driving transistor Tdr is set to the voltage Vdd supplied to the voltage supply line 17 at that time. The operations of the writing period Pwrt and the driving period Pdrv are the same as those in the third embodiment.

As described above, in the present embodiment, since the gate voltage Vg is initialized to the voltage Vdd before the writing period Pwrt, it is possible to accurately accumulate the charge according to the data voltage Vdata in the capacitor element C in each writing period Pwrt regardless of the quantity of charge accumulated in the capacitor element C in the past frame. Accordingly, according to the present embodiment, as compared with the first embodiment, it is possible to control each electro-optical element 11 with a predetermined gray-scale level in high precision.

Modification

Various modifications can be made in the above-mentioned embodiments. An aspect of a specific modification is as follows. Various modifications to be described below may be appropriately combined.

First Modification

The waveforms of the signals D[1] to D[n] in the driving period Pdrv (waveforms of the control voltage Vct1) are appropriately modified. For example, in the above-mentioned embodiments, the chopping wave whose waveforms are axisymmetric on the basis of the middle point tc of the driving period Pdrv has been exemplified, but the invention is not limited thereto. For example, various waveforms, such as a ramp wave, a sawtooth wave, a multiramp wave (staircase wave), and the like are applied to the control voltage Vct1. In addition, not only a waveform in which the voltage value linearly varies but also a waveform, such as a sine wave, in which the voltage value varies in a curve shape may be applied to applied to the control voltage Vct1.

Further, in the above-mentioned embodiments, the structure in which the control voltage Vct1 in the driving period Pdrv becomes a waveform of one cycle of the chopping wave has been exemplified, but continuous waveforms (in the driving period Pdrv) of various unit waveforms, such as the chopping wave, the ramp wave, the sawtooth wave, or the like (that is, waveforms in which the increase and the decrease of the voltage are repeated many times) may be may be applied to the control voltage Vct1. As such, in the electronic device D according to the embodiment of the invention, various waveforms whose voltage varies when the time passes in the driving period Pdrv can be adopted as the control voltage Vct1.

Second Modification

In the fourth and fifth embodiments, the structure in which the voltage Vn of the connection node N is set to the voltage Vdd in the initialization period Prs1 has been exemplified, but the voltage set to the voltage Vn in the initialization period is appropriately changed. However, in order to allow the current I0 to surely flow in the writing period Pwrt in which the voltage A of the voltage supply line 17 is set to the voltage Vss, the voltage Vn in the initialization period Prs1 is preferably is preferably set to a voltage that is higher than a voltage (Vss+Vth_TR) corresponding to a sum between the voltage Vss and the threshold voltage Vth_TR of the driving transistor Tdr.

In the sixth embodiment, in the initialization period Prs2, the structure in which the gate voltage Vg is set to the voltage Vdd has been exemplified, but the voltage set to the gate voltage Vg in the initialization period Prs2 may be arbitrarily set. For example, the voltage A of the voltage supply line 17 in the initialization period Prs2 may be set to the voltage Vss, and the gate voltage Vg may be set to the voltage Vss in the initialization period Prs2.

Third Modification

The structure of each of the unit circuits U is appropriately changed. Specifically, the conductive type of each transistor forming the unit circuit U in the above-mentioned embodiments is arbitrarily set. For example, the transistor T1 in the third embodiment may be composed of a p-channel-type transistor, and the transistor T2 in the fourth embodiment and the fifth embodiment or the transistor T3 in the sixth embodiment may be composed of an n-channel-type transistor.

Further, in the above-mentioned embodiments, the structure in which the driving transistor Tdr is composed of an n-channel-type transistor has been exemplified. However, the driving transistor Tdr may be composed of a p-channel-type transistor. In the structure in which the p-channel-type driving transistor Tdr is adopted, even though the voltage A of the voltage supply line 17 is not changed in the writing period Pwrt and the driving period Pdrv, it is possible to achieve the same advantages and effects as the above-mentioned embodiments. In this structure, in the writing period Pwrt (the voltage A is the voltage Vdd that is equal to that in the driving period Pdrv), if the transistor T1 is turned on, the voltage of the drain of the driving transistor Tdr (that is, anode of the electro-optical element 11) is set to a voltage (Vdd−Vth_TR) obtained by subtracting the threshold voltage Vth_TR from the voltage Vdd.

Fourth Modification

In the above-mentioned embodiments, the OLED element has been exemplified as the electro-optical element 11. However, the electro-optical element that is adopted in the electronic device of the invention is not limited thereto. For example, in addition to the OLED element, various self-emission elements, such as an inorganic EL element, a field emission (FE) element, a surface-conduction electron-emitter (SE) element, a ballistic electron surface emitting (BS) element, and a light-emitting diode (LED) element, and various electro-optical elements, such as an electrophoresis element, an electrochromic element, a liquid crystal element, or the like may be used. Further, the invention may be applied to a sensing device, such as a biochip or the like. In the invention, the driven element is a concept that includes all elements that are driven by applying an electric energy. The electro-optical element such as the light-emitting element is only an example of the driven element.

Application

Next, examples of electronic apparatuses that use the electronic devices according to the embodiments of the invention will be described.

Figure 23:
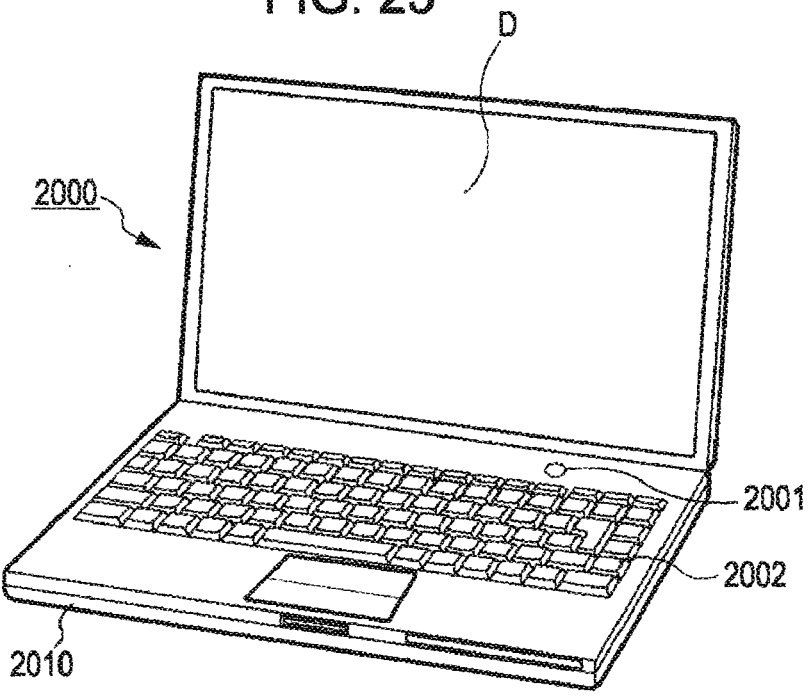
FIG. 23 is a perspective view illustrating a first example (personal computer) of an electronic apparatus of the invention.

FIG. 23 is a perspective view illustrating a structure of a mobile personal computer that uses the electronic device D according to the above-mentioned embodiment as a display device. A personal computer 2000 includes an electronic device D that serves as a display device, and a main body portion 2010. In the main body portion 2010, a power supply switch 2001 and a keyboard 2002 are provided. Since an OLED element is used as an electro-optical element 11 in the electronic device D, a viewing angle is wide, and clear screen display can be made.

Figure 24:
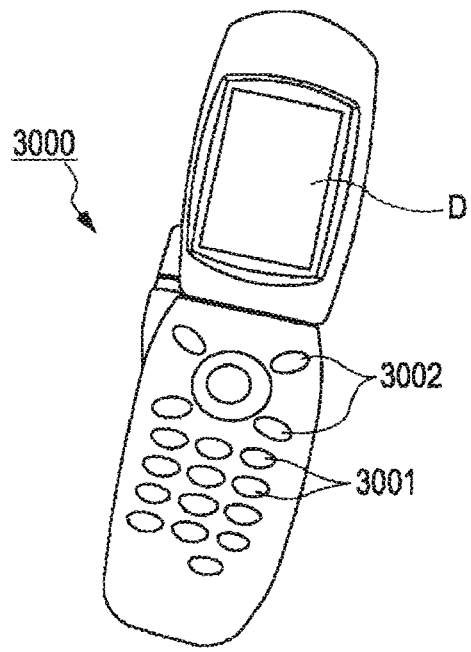
FIG. 24 is a perspective view illustrating a second example (cellular phone) of an electronic apparatus of the invention.

FIG. 24 is a diagram illustrating a structure of a cellular phone to which the electronic device D according to the above-mentioned embodiment is applied. A cellular phone 3000 includes a plurality of operation buttons 3001, a plurality of scroll buttons 3002, and an electronic device D that serves as a display device. The scroll button 3002 is operated, and a screen displayed on the display device D is scrolled.

Figure 25:
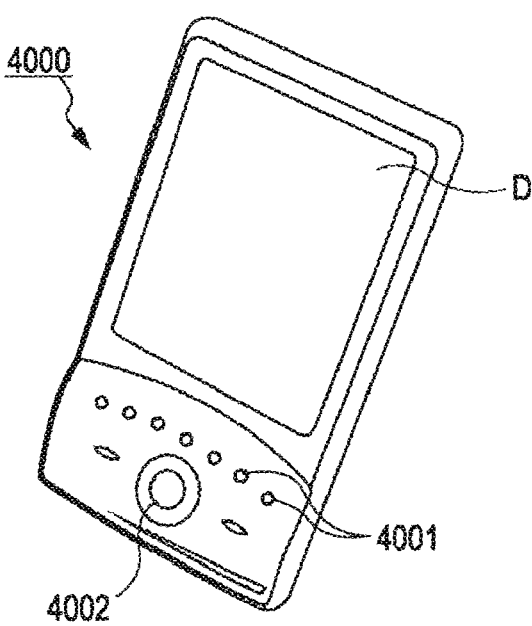
FIG. 25 is a perspective view illustrating a third example (personal digital assistant) of an electronic apparatus of the invention.

FIG. 25 is a diagram illustrating a structure of a personal digital assistant (PDA) to which the electronic device D according to the above-mentioned embodiment is applied. A personal digital assistant 4000 includes a plurality of operation buttons 4001, a power supply switch 4002, and an electronic device D that serves as a display device. If the power supply switch 4002 is operated, a variety of information, such as an address book and a date book, is displayed on the electronic device D.

Examples of the electronic apparatus to which the electronic device (electro-optical device) according to the embodiments of the invention is applied may include, in addition to those shown in FIGS. 23 to 25, a digital still camera, a television, a video camera, a car navigation device, a pager, an electronic note, an electronic paper, an electronic calculator, a word processor, a workstation, a video phone, a POS terminal, a printer, a scanner, a copy machine, a video player, and an apparatus having a touch panel. The electronic device according to the embodiments of the invention is not used only for image display. For example, in image forming apparatuses, such as an optical writing type printer or an electronic copy machine, a writing head for exposing a photoreceptor according to images to be formed on a recording material such as paper is used. The electronic device according to the embodiment of the invention may be used as this kind of writing head. The unit circuit is a concept that includes a circuit becoming a unit of exposure in the image forming apparatus, in addition to a circuit forming a pixel of the display device (so-called pixel circuit).

What is claimed is:

1. An electronic device comprising:
  a plurality of first wiring lines;
  a plurality of second wiring lines that intersects the plurality of first wiring lines;
  a plurality of unit circuits; and
  a plurality of reference signal lines that supply reference signals to the plurality of unit circuits,
  each of the plurality of unit circuits having:
    a driven element that is driven by a driving voltage or a driving current;

a driving unit that supplies the driving voltage or the driving current to the driven element;

a switching element that controls electrical connection between an input terminal provided in the driving unit and one second wiring line of the plurality of second wiring lines; and a capacitor element that has a first electrode coupled to the input terminal and a second electrode coupled to one reference signal line of the plurality of reference signal lines and that accumulates a charge between the first electrode and the second electrode, in a first period, a data signal being supplied to the input terminal through the one second wiring line and the switching element such that a potential of the input terminal is set, the driving unit supplying the driving voltage or the driving current to the driven element in one of a period in which the potential of the input terminal set by the data signal in the first period is greater than a predetermined potential and a period in which the potential of the input terminal is smaller than the predetermined potential, the potential of the one reference signal line being set to a first potential when the potential of the input terminal is set by the data signal in the first period, the potential of the one reference signal line when a second period starts being the first potential, the potential of the one reference signal line becoming a second potential that has a voltage level different from the first potential, in the second period, the potential of the one reference signal line when the second period is completed being the first potential, and the variation in the potential of the one reference signal line in the second period being axisymmetric on the basis of a time point when the potential of the one reference signal line becomes the second potential.

2. The electronic device according to claim 1, the plurality of reference signal lines intersecting the plurality of second wiring lines.

3. The electronic device according to claim 1, a potential of each of the plurality of reference signal lines varying with a predetermined cycle.

4. The electronic device according to claim 3, further comprising:

a selection circuit that selects each of the plurality of first wiring lines; and a signal generating circuit that sequentially supplies the reference signals to the plurality of reference signal lines in the order in which the first wiring lines are selected.

5. The electronic device according to claim 1, a time length of a driving period in which the driving voltage or the driving current is supplied to the driven element corresponding to the potential of the input terminal set in the first period.

6. The electronic device according to claim 1, the potential of the input terminal varying from the potential set by the data signal in the first period according to a variation in a potential of the one reference signal line.

7. The electronic device according to claim 6, the input terminal being in a floating state in at least a portion of the driving period in which the driving voltage or the driving current is supplied to the driven element.

8. The electronic device according to claim 1, each of the plurality of unit circuits further including a reset unit that sets the potential of the input terminal to a predetermined potential before the first period in which the data signal is supplied to the input terminal through the one second wiring line and the switching element.

9. An electronic apparatus comprising the electronic device according to claim 1.

* * * * *

UNITED STATES PATENT AND TRADEMARK OFFICE
CERTIFICATE OF CORRECTION

PATENT NO. : 7,639,211 B2
APPLICATION NO. : 11/456307
DATED : December 29, 2009
INVENTOR(S) : Takashi Miyazawa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 746 days.

Signed and Sealed this

Ninth Day of November, 2010

David J. Kappos
*Director of the United States Patent and Trademark Office*